(12) United States Patent  
Okita

(10) Patent No.: US 8,355,113 B2  
(45) Date of Patent: Jan. 15, 2013

(54) EXPOSURE APPARATUS, EXPOSURE METHOD AND DEVICE MANUFACTURING METHOD

(75) Inventor: Shinichi Okita, Tokyo (JP)

(73) Assignee: Nikon Corporation, Tokyo (JP)

( * ) Notice: Subject to any disclaimer, the term of this patent is extended or adjusted under 35 U.S.C. 154(b) by 978 days.

(21) Appl. No.: 12/314,571

(22) Filed: Dec. 12, 2008

(65) Prior Publication Data

US 2009/0153819 A1    Jun. 18, 2009

Related U.S. Application Data

(60) Provisional application No. 61/006,907, filed on Feb. 5, 2008.

(30) Foreign Application Priority Data

Dec. 17, 2007    (JP) ................. 2007-325222

(51) Int. Cl.
  *G03B 27/42*    (2006.01)
  *G03B 27/58*    (2006.01)
  *G03B 27/62*    (2006.01)
(52) U.S. Cl. ................. 355/53; 355/72; 355/75
(58) Field of Classification Search ............ 355/53, 355/77, 72, 75

See application file for complete search history.

(56) References Cited

U.S. PATENT DOCUMENTS

| 6,611,316 | B2 | 8/2003 | Sewell |
| 2007/0013884 | A1* | 1/2007 | Kim ................. 355/53 |
| 2007/0153247 | A1 | 7/2007 | Nagasaka |
| 2007/0242255 | A1 | 10/2007 | Nagasaka |
| 2007/0258077 | A1 | 11/2007 | Tanaka et al. |

FOREIGN PATENT DOCUMENTS

| JP | A-9-7933 | 1/1997 |
| JP | A-09-007933 | 1/1997 |

* cited by examiner

*Primary Examiner* — Peter B Kim

(74) *Attorney, Agent, or Firm* — Oliff & Berridge, PLC

(57) ABSTRACT

An exposure apparatus restricts reduction in throughput. The exposure apparatus controls movement such that, (1) when a substrate is moving in one direction, a first pattern is moved in a specified direction to expose a first shot region using a first exposure light, then movement of the substrate in the one direction continues while moving the second pattern in the specified direction to expose a second shot region, and (2) then the respective movement directions of the substrate and the second pattern are reversed to expose a third shot region using the second exposure light, then movement of the substrate in the reverse direction continues while moving the first pattern in a direction that is the reverse of the specified direction to expose a fourth shot region using the first exposure light.

20 Claims, 14 Drawing Sheets

EXPOSURE APPARATUS, EXPOSURE METHOD AND DEVICE MANUFACTURING METHOD

CROSS-REFERENCE TO RELATED APPLICATION

This Non-Provisional Application claims the benefit of U.S. Provisional Application No. 61/006,907 filed Feb. 5, 2008, the disclosure of which is incorporated herein by reference in its entirety. The disclosure of the following priority application is incorporated herein by reference in its entirety: Japanese Patent Application No. 2007-325222 filed in Japan on Dec. 17, 2007.

BACKGROUND

The present invention relates to exposure apparatus that expose a substrate, exposure methods and device manufacturing methods.

An exposure apparatus used in a photolithography process illuminates a pattern using exposure light and sequentially exposes a plurality of shot regions on a substrate using exposure light from that pattern. One of the performance demands on exposure apparatus is an improvement of throughput. For this reason, technology that sequentially exposes the shot regions on the substrate using two or more patterns, such as that disclosed in Japanese Laid-Open Application No. 9-007933, for example, has been proposed. The exposure apparatus disclosed in Japanese Laid-Open Application No. 9-007933 is a scanning type exposure apparatus, and it synchronously moves a pattern relative to the illumination region of an illumination system and a shot region relative to the projection area of the projection optical system while exposing that shot region.

SUMMARY

A scanning type exposure apparatus performs an operation that moves a pattern to an exposure start position, an operation that starts movement the pattern for scanning exposure, and an operation that moves the pattern up to the exposure end position at a prescribed velocity with respect to the illumination region. In the case in which two patterns are used to perform exposure, for example, as described in Japanese Laid-Open Application No. 9-007933 discussed above, after one of the patterns has ended movement for scanning exposure, during the period from when the other pattern starts movement for scanning exposure until it ends, the one pattern, which had previously ended scanning exposure, must return to the start position for the next scanning exposure. The time required for this "return operation" has the possibility of lengthening the time until scanning exposure that uses the one pattern starts. As a result, throughput does not improve, and even if two patterns are used, for example, improvement of device productivity cannot be expected. In this way, it is difficult to improve device performance merely by using two patterns.

One aspect of the present invention is to provide exposure apparatus and exposure methods that are able to practically improve throughput. Another aspect of the present invention is to provide device manufacturing methods able to practically improve device productivity.

According to a first aspect of the present invention, an exposure apparatus that exposes a substrate includes a first moving apparatus that moves a first pattern in a prescribed scanning direction, a second moving apparatus that moves a second pattern in the prescribed scanning direction, a substrate moving apparatus that moves a substrate having a plurality of shot regions in a prescribed scanning direction to a first exposure region to which a first exposure light from the first pattern is irradiated, and to a second exposure region to which a second exposure light from the second pattern is irradiated. A control apparatus controls the first moving apparatus, the second moving apparatus and the substrate moving apparatus in accordance with a first exposure mode that, (1) when the substrate is moving in one direction, moves the first pattern in a prescribed direction to expose a first shot region on the substrate using the first exposure light irradiated to the first exposure region, (2) then continues moving the substrate in the one direction while moving the second pattern in a specified direction to expose a second shot region on the substrate, (3) then makes the respective movement directions of the substrate and the second pattern reverse to expose a third shot region on the substrate using the second exposure light irradiated to the second exposure region, and (4) then continues moving the substrate in the reverse direction while moving the first pattern in a direction that is the reverse of the prescribed direction to expose a fourth shot region on the substrate using the first exposure light irradiated to the first exposure region.

According to a second aspect of the present invention, an exposure apparatus that exposes a substrate includes a first moving apparatus that moves a first pattern in a prescribed scanning direction, a second moving apparatus that moves a second pattern in the prescribed scanning direction, a third moving apparatus that moves a third pattern in the prescribed scanning direction, a substrate moving apparatus that moves a substrate having a plurality of shot regions in a prescribed scanning direction to a first exposure region to which a first exposure light from the first pattern is irradiated, to a second exposure region to which a second exposure light from the second pattern is irradiated, and to a third exposure region to which a third exposure light from the third pattern is irradiated. A control apparatus controls the first moving apparatus, the second moving apparatus, the third moving apparatus and the substrate moving apparatus so that, (1) when the substrate is moving in one direction, a preparatory operation is performed for moving the second pattern in a prescribed direction to expose a second shot region on the substrate using the second exposure light irradiated to the second exposure region while moving the first pattern in a prescribed direction to expose a first shot region on the substrate using the first exposure light irradiated to the first exposure region, and a preparatory operation is performed for moving the third pattern in a prescribed direction to expose a third shot region on the substrate using the third exposure light irradiated to the third exposure region while a preparatory operation is preformed for moving the first pattern in a direction that is the reverse of the prescribed direction, and (2) then moving the first pattern in the prescribed direction to expose a fourth shot region on the substrate using the first exposure light irradiated to the first exposure region.

According to a third aspect of the present invention, a device manufacturing method includes exposing a substrate using an exposure apparatus of the first or second aspects described above, and developing the exposed substrate.

According to a fourth aspect of the present invention, an exposure method exposes a substrate. The method includes (1) moving the substrate in one direction while synchronously moving the first pattern in a prescribed direction with respect to the first exposure light to expose a first shot region on the substrate using the first exposure light from the first pattern, then (2) continuing to move the substrate in the one direction while moving the second pattern in a specified direction to expose a second shot region on the substrate, which is adjacent to the first shot region, using the second exposure light from the second pattern, (3) continuing to move the substrate in the one direction while synchronously moving the second pattern in the specified direction to expose the second shot region using the second exposure light from the second pattern, then (3) making the respective movement directions of the substrate and the second pattern reverse, and (4) moving the substrate in the reverse direction while synchronously moving the second pattern in the reverse direction to expose a third shot region on the substrate using the second exposure light from the second pattern, and (5) continuing to move the substrate in the reverse direction consecutively with exposure of the third shot region while moving the first pattern in the same direction as the movement direction of the second pattern to expose a fourth shot region on the substrate, which is adjacent to the third shot region, using the first exposure light from the first pattern.

According to a fifth aspect of the present invention, a device manufacturing method includes exposing a substrate using an exposure apparatus of the fourth aspect described above, and developing the exposed substrate.

According to aspects of the present invention, it is possible to achieve improvement of throughput, and it is possible to improve device productivity.

DETAILED DESCRIPTION OF EMBODIMENTS

Figure 1:
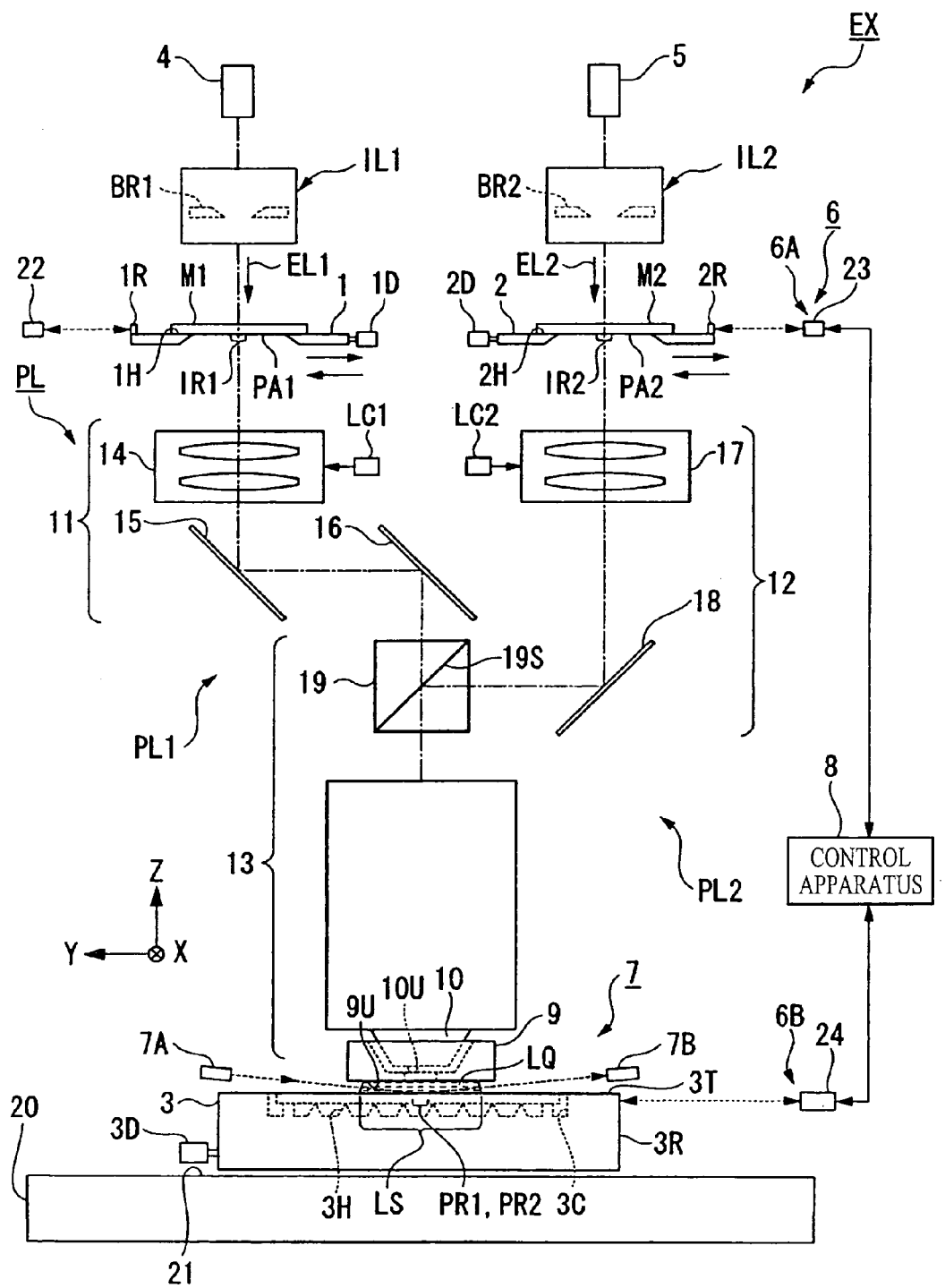
FIG. 1 is a schematic block diagram that shows an example of an exposure apparatus relating to a first embodiment.

Embodiments of the invention will be described below while referring to the drawings. The invention is not limited to the illustrated embodiments. In the following description, an XYZ rectangular coordinate system is set up, and the positional relationships among the respective members will be described while referring to this XYZ rectangular coordinate system. In addition, a prescribed direction within the horizontal plane is considered the X axis direction, a direction orthogonal to the X axis direction within the horizontal plane is considered the Y axis direction, and a direction (specifically, the vertical direction) orthogonal to the X axis direction and the Y axis direction is considered the Z axis direction. Also, the directions of rotation (tilt) about the X axis, the Y axis and the Z axis are respectively considered the θX, θY and θZ directions.

First Embodiment

FIG. 1 is a schematic block diagram that shows an example of an exposure apparatus EX according to a first embodiment. In FIG. 1, the exposure apparatus EX comprises a first mask stage 1 and a second mask stage 2. The first mask stage 1 holds a first mask M1, on which a first pattern PA1 is formed, and is movable. The second mask stage 2 holds a second mask M2, on which a second pattern PA2 is formed, and is movable. A substrate stage 3 holds a substrate P (shown in other figures) and is movable. A first illumination system IL1 illuminates the first pattern PA1 using a first exposure light EL1 from a first light source apparatus 4, and a second illumination system IL2 illuminates the second pattern PA2 using a second exposure light EL2 from a second light source apparatus 5. A projection optical system PL projects an image of the first pattern PA1 illuminated by the first exposure light EL1 and an image of the second pattern PA2 illuminated by the second exposure light EL2 to the substrate P. An interferometer system 6 measures the respective position information of the first mask stage 1, the second mask stage 2 and the substrate stage 3. A focus leveling detection system 7 detects position information (surface position information) of the surface of the substrate P held by the substrate stage 3. A control apparatus 8 controls the operations of the entire exposure apparatus EX.

In addition, the exposure apparatus EX of the present embodiment is a liquid immersion exposure apparatus that exposes a substrate P via a liquid LQ, such as that disclosed, for example, in U.S. Patent Application Publication No. 2005/0280791 and U.S. Patent Application Publication No. 2007/0127006, and it comprises a liquid-immersion member 9 that forms a liquid immersion space LS so that at least a part of the optical paths of the first and second exposure lights EL1, EL2 are filled with the liquid LQ. The liquid immersion space LS is a space that is filled with a liquid LQ. In the present embodiment, water (pure water) is used as the liquid LQ. The liquid LQ may be a liquid other than water.

The first mask M1 and the second mask M2 include a reticle on which a device pattern that is projected to the substrate P is formed. The first and second masks M1, M2 can be, for example, a transmitting type mask on which a prescribed pattern is formed on a transparent plate such as, for example, a glass plate using a light shielding film such as chrome, etc. The transmitting type mask is not limited to a binary mask, in which a pattern is formed by a light shielding film, but also includes phase shift masks such as halftone types or spatial frequency modulation types. In the present embodiment, a transmitting type mask is used as the first and second masks M1, M2. A reflecting type mask may also be used as the first and second masks M1, M2. In addition, in the present embodiment, the first mask M1 and the second mask M2 are identical types of masks. In the present embodiment, both the first mask M1 and the second mask M2 are binary masks. Both the first mask M1 and the second mask M2 may also be phase shift masks. In addition, the first mask M1 and the second mask M2 may be different types of masks. For example, one of the first mask M1 and the second mask M2 may be a binary mask, and the other may be a phase shift mask.

The substrate P is a substrate for manufacturing a device. The substrate P may be those in which a photosensitive film is formed on a base material, for example, a semiconductor wafer such as a silicon wafer. The photosensitive film is a photosensitive material (photoresist) film. In addition, the substrate P may include a film other than a photosensitive film. For example, the substrate P may also include a reflection preventing film and may also include a protective film (top coat film) that protects the photosensitive film from the liquid during liquid immersion exposure.

The projection optical system PL sets a first exposure region PR1 to which the first exposure light EL1 from the first pattern PA1 is irradiated and a second exposure region PR2 to which the second exposure light EL2 from the second pattern PA2 is irradiated at a prescribed positional relationship at the image plane side of the projection optical system PL. The projection optical system PL forms an image of the first pattern PA1 in the first exposure region PR1 and forms an image of the second pattern PA2 in the second exposure region PR2. An image of the first pattern PA1 is formed in the first exposure region PR1 by means of the first exposure light EL1, which is emitted from the first illumination system IL1 and is irradiated to the first exposure region PR1 via the first pattern PA1 and the projection optical system PL. In addition, an image of the second pattern PA2 is formed in the second exposure region PR2 by means of the second exposure light EL2, which is emitted from the second illumination system IL2 and is irradiated to the second exposure region PR2 via the second pattern PA2 and the projection optical system PL.

The exposure apparatus EX of the present embodiment is a scanning type exposure apparatus (a so-called scanning stepper) that synchronously moves the first mask M1, the second mask M2 and the substrate P in the respective scanning directions while projecting an image of the first pattern PA1 of the first mask M1 and an image of the second pattern PA2 of the second mask M2 onto the substrate P. In the present embodiment, the scanning direction (synchronous movement direction) of the first mask M1, the second mask M2 and the substrate P is the Y axis direction. The control apparatus 8 controls the first mask stage 1, the second mask stage 2 and the substrate stage 3 so that movement of the first mask M1 and the second mask M2 in the Y axis direction and movement of the substrate P in the Y axis direction are synchronously performed. The substrate stage 3 moves the substrate P having a plurality of shot regions in the Y axis directions (scanning direction) with respect to the first exposure region PR1 and the second exposure region PR2.

In the present embodiment, the control apparatus 8 switches between a first exposure mode and a second exposure mode. The first exposure mode includes an operation that exposes one shot region on the substrate P using the first exposure light EL1 from the first pattern PA1 irradiated to the first exposure region PR1 and exposes another shot region on the substrate P using the second exposure light EL2 from the second pattern PA2 irradiated to the second exposure region PR2. Therefore, in the first exposure mode, the image of the first pattern PA1 and the image of the second pattern PA2 are not superposed on the substrate P, but rather are projected onto different shot regions on the substrate. The second exposure mode includes an operation that exposes the same one shot region on the substrate P using the first exposure light EL1 from the first pattern PA1 irradiated to the first exposure region PR1 and the second exposure light EL2 from the second pattern PA2 irradiated to the second exposure region PR2. Specifically, in the first exposure mode, so-called single patterning processing is executed, and, in the second exposure mode, so-called double patterning (dual exposure, multiple exposure) processing is executed.

In addition, in the first exposure mode, the second pattern PA2 is not illuminated by the second exposure light EL2 while (at the same time that) the first pattern PA1 is illuminated by the first exposure light EL1. Alternatively, a light shielding apparatus that shields the optical path of the second exposure light EL is moved in front of the second exposure region PR2 so that even if the second pattern PA2 is illuminated by the second exposure light EL2 while the first pattern PA1 is illuminated by the first exposure light EL1, the second exposure light EL2 is not irradiated to the second exposure region PR2. In addition, in the first exposure mode, the first pattern PA1 is not illuminated by the first exposure light EL1 while (at the same time that) the second pattern PA2 is illuminated by the second exposure light EL2. Alternatively, a light shielding apparatus that shields the optical path of the first exposure light EL1 is moved in front of the first exposure region PR1 so that even if the first pattern PA1 is illuminated by the first exposure light EL1 while the second pattern PA2 is illuminated by the second exposure light EL2, the first exposure light EL1 is not irradiated to the first exposure region PR1. In the second exposure mode, an operation in which the second pattern PA2 is illuminated by the second exposure light EL2 is executed in parallel with (at the same time as) at least a part of the operation in which the first pattern PA1 is illuminated by the first exposure light EL1.

In addition, in the present embodiment, in the first exposure mode, the first pattern PA1 and the second pattern PA2 are identical patterns, and, in the second exposure mode, the first pattern PA1 and the second pattern PA2 are different patterns. With respect to the first exposure mode, the first pattern PA1 and the second pattern PA2 may also be different patterns.

First, the first light source apparatus 4 and the second light source apparatus 5 will be described. The first light source apparatus 4 emits the first exposure light EL1, and the second light source apparatus 5 emits the second exposure light EL2. Used as the first and second exposure light EL1, EL2 that emerges from the first and second light source apparatus 4, 5 are, for example, deep ultraviolet light (DUV light) such as bright lines (g-lines, h-lines, i-lines) that emerge from a mercury lamp and KrF excimer laser light (wavelength of 248 nm) or vacuum ultraviolet light (VUV light) such as ArF excimer laser light (wavelength of 193 nm) and $F_2$ laser light (wavelength of 157 nm). In the present embodiment, ArF excimer laser apparatus are used for the first and second light source apparatus 4, 5, and ArF excimer laser light is used as the first and second exposure light EL1, EL2.

Next, the first illumination system EL1 and the second illumination system IL2 will be described. In the present embodiment, the first illumination system IL1 includes a beam expander, a polarization state switching optical system, a catoptric optical element, an afocal optical system (no focal point optical system), a zoom optical system, a polarization conversion element, an optical integrator, and a condenser optical system, etc. as disclosed, for example, in the specification of U.S. Patent Application Publication No. 2006/0170901 and performs illumination of a prescribed first illumination region IR1 using the first exposure light EL1, which has a uniform illumination intensity distribution.

In addition, the first illumination system IL1 comprises a first optical mechanism BR1, which defines the first illumination region IR1. The first optical mechanism BR1 adjusts at least one of the size, shape and position (including the rotation position) of the first illumination region IR1. In the present embodiment, the first optical mechanism BR1 includes a blind apparatus (masking system) that has a fixed blind that defines the first illumination region IR1 resulting from the first exposure light EL1 on the first mask M1 and a movable blind for restricting unnecessary exposure of the substrate P by the first exposure light EL1, such as that disclosed in, for example, U.S. Pat. No. 6,597,002. The first optical mechanism BR1 comprises a plurality of movably blinds that are independently movably arranged at positions that are nearly optically conjugate with the pattern forming surface of the first mask M1 within the first illumination system IL1. The first optical mechanism BR1 changes the size (width) of the first illumination region IR1 on the first mask M1 by means of movement of at least one of the plurality of light shielding plates. The control apparatus 8 adjusts the size (width) of the first exposure region PR1 by controlling the first optical mechanism BR1 to adjust the size (width) of the first illumination region IR1. In addition, the control apparatus 8 uses the first optical mechanism BR1 to control the start and end of scanning exposure of the substrate P by the first exposure light EL1 irradiated to the first exposure region PR1. Through this operation, the control apparatus 8 restricts unnecessary exposure outside one shot region on the substrate P to be exposed by means of one scanning exposure operation.

The second illumination system IL2 has nearly the same configuration as the first illumination system IL1 and illuminates the prescribed second illumination region IR2 using the second exposure light EL2, which has a uniform illumination intensity distribution. The second illumination system IL2 has a second optical mechanism BR2 that defines a second illumination region IR2. The second optical mechanism BR2 adjusts at least one of the size, shape and position (including the rotation position) of the second illumination region IR2. In the same way as the first optical mechanism BR1, the second optical mechanism BR2 includes a blind apparatus (masking system) such as that disclosed in, for example, U.S. Pat. No. 6,597,002. The control apparatus 8 uses the second optical mechanism BR2 to control the start and end of scanning exposure of the substrate P by the second exposure light EL2 irradiated to the second exposure region PR2. Through this operation, the control apparatus 8 restricts unnecessary exposure outside one shot region on the substrate P to be exposed by means of one scanning exposure operation.

In the present embodiment, the first illumination system IL1 illuminates the first pattern PA1 using the first exposure light EL1, which is in a first polarization state, and the second illumination system IL2 illuminates the second pattern PA2 using the second exposure light EL2, which is in a second polarization state that differs from the first polarization state. The first polarization state is, for example, the S polarization state, and the second polarization state is, for example, the P polarization state. The first and second patterns PA1, PA2 may also be illuminated using first and second exposure lights EL1, EL2 of the same polarization state. In addition, at least one of the first and second exposure lights EL1, EL2 may be in a random polarization state (non-polarization state).

Next, the first mask stage 1 and the second mask stage 2 will be described. The first mask stage 1 has a first mask holding part 1H, which holds the first mask M1. The first mask holding part 1H inserts and removes the first mask M1. In the present embodiment, the first mask holding part 1H holds the first mask M1 so that the pattern forming surface of the first mask M1 and the XY plane are nearly parallel. The first mask stage 1 is driven by means of the first mask stage drive system 1D. The first mask stage drive system 1D includes an actuator such as a linear motor. The first mask stage 1 holds the first mask M1 and moves within the XY plane by means of actuation of the first mask stage drive system 1D. In the present embodiment, the first mask stage 1 moves in the three directions of the X axis, Y axis and θZ directions in a state in which the first mask M1 is held by the first holding part 1H. When a shot region on the substrate P is exposed by the first exposure light EL1 irradiated to the first exposure region PR1, the first mask stage 1 moves the first pattern PA1 in the scanning direction (Y axis directions) to the first illumination region IR1.

The second mask stage 2 has a second mask holding part 2H, which holds the second mask M2. The second mask holding part 2H inserts and removes the second mask M2. In the present embodiment, the second mask holding part 2H holds the second mask M2 so that the pattern forming surface of the second mask M2 and the XY plane become nearly parallel. The second mask stage is driven by means of the second mask stage drive system 2D. The second mask stage drive system 2D includes an actuator such as a linear motor. The second mask stage 2 holds the second mask M2 and moves within the XY plane by means of actuation of the second mask stage drive system 2D. In the present embodiment, the second mask stage 2 moves in the three directions of the X axis, Y axis and θZ directions in a state in which the second mask M2 is held by the second holding part 2H. When the shot region on the substrate P is exposed by the second exposure light EL2 irradiated to the second exposure region PR2, the second mask stage 2 moves the second pattern PA2 in the scanning direction (Y axis directions) to the second illumination region IR2.

Next, the projection optical system PL will be described. The projection optical system PL projects an image of the first pattern PA1 illuminated by the first exposure light EL1 and an image of the second pattern PA2 illuminated by the second exposure light EL2 onto the substrate P at a prescribed projection magnification. The projection optical system PL of the present embodiment is a reduction system whose projection magnification is, for example, a ¼, ⅕ or ⅛. In addition, the projection optical system PL of the present embodiment forms an inverted image.

Note that the projection optical system PL may also be a magnification or enlargement system. The projection optical system PL may also be any of a dioptric system that does not include a reflecting optical element, a catoptric system that does not include a refracting optical element, or a catadioptric system that includes both a reflecting optical element and a refracting optical element. In addition, the projection optical system PL may also form an erect image.

The projection optical system PL of the present embodiment has a terminal (or final) optical element 10 that opposes the substrate P. The terminal optical element 10 has an exit plane (lower surface) 10U that emits the first and second exposure lights EL1, EL2 to the first and second exposure regions PR1, PR2. The substrate stage 3 and the substrate P held by the substrate stage 3 move to a position that opposes the exit plane 10U. In the present embodiment, the first and second exposure regions PR1, PR2 to which the first and second exposure lights EL1, EL2 are irradiated include positions that oppose the exit plane 10U.

The terminal optical element 10 is the optical element nearest the image plane of the projection optical system PL from among the plurality of optical elements of the projection optical system PL. The projection optical system PL irradiates the first exposure light EL1 to the first exposure region PR1 and irradiates the second exposure light EL2 to the second exposure region PR2 via the terminal optical element 10.

In the present embodiment, the projection optical system PL includes a common optical system 13 that includes the terminal optical element 10, a first individual optical system 11 that guides the first exposure light EL1 from the first pattern PA1 to the common optical system 13, and a second individual optical system 12 that guides the second exposure light EL2 from the second pattern PA2 to the common optical system 13.

The first individual optical system 11 includes a first image forming optical system 14 into which the first exposure light EL1 from the first pattern PA1 is incident, a first reflecting mirror 15 to which the first exposure light EL1, which has come via the first image forming optical system 14, is incident, and a second reflecting mirror 16 to which the first exposure light EL1, which has come via the first reflecting mirror 15, is incident.

The second individual optical system 12 includes a second image forming optical system 17 into which the second exposure light EL2 from the second pattern PA2 is incident and a third reflecting mirror 18 to which the second exposure light EL2, which has come via the second image forming optical system 17, is incident.

The common optical system 13 includes a polarizing beam splitter 19 into which the first exposure light EL1, which has come via the second reflecting mirror 16, and the second exposure light EL2, which has come via the third reflecting mirror 18, are incident, the terminal optical element 10, and a plurality of optical elements, which are arranged between the polarizing beam splitter 19 and the terminal optical element 10 and guide the first and second exposure lights EL1, EL2 from the polarizing beam splitter 19 to the terminal optical element 10.

The first image forming optical system 14 is arranged below the first mask stage 1 to correspond to the first mask stage 1. The first image forming optical system 14 corrects the shape of the first exposure light EL1 which has passed through the first pattern PA1. The first reflecting mirror 15 is arranged below the first image forming optical system 14. The first reflecting mirror 15 guides the first exposure light EL1 from the first image forming optical system 14 to the second reflecting mirror 16. The second reflecting mirror 16 is arranged above the polarizing beam splitter 19. The second reflecting mirror 16 guides the first exposure light EL1 from the first reflecting mirror 15 to the polarizing beam splitter 19.

The second image forming optical system 17 is arranged below the second mask stage 2 to correspond to the second mask stage 2. The second image forming optical system 17 corrects the shape of the second exposure light EL2, which has passed through the second pattern PA2. The third reflecting mirror 18 is arranged below the second image forming optical system 17. The third reflecting mirror 18 guides the second exposure light EL2 from the second image forming optical system 17 to the polarizing beam splitter 19.

The polarizing beam splitter 19 has a polarization separation surface 19S and allows the first exposure light EL1 from the second reflecting mirror 16 to pass through and changes the direction of the second exposure light EL2 from the third reflecting mirror 18. The first and second exposure lights EL1, EL2, which have passed through the polarizing beam splitter 19, are guided to the terminal optical element 10. The first and second exposure lights EL1, EL2 incident to the terminal optical element 10 are irradiated to the first and second exposure regions PR1, PR2 from the exit plane 10U of that terminal optical element 10.

In this way, in the present embodiment, the first exposure light EL1 from the first pattern PA1 is irradiated to the first exposure region PR1 via the first individual optical system 11 and the common optical system 13, and an image of the first pattern PA1 is formed on the first exposure region PR1 by means of that first individual optical system 11 and the common optical system 13. In addition, the second exposure light EL2 from the second pattern PA2 is irradiated to the second exposure region PR2 via the second individual optical system 12 and the common optical system 13, and an image of the second pattern PA2 is formed on the second exposure region PR2 by means of that second individual optical system 12 and the common optical system 13. In the present embodiment, a first optical system PL1 and a second optical system PL2 share the common optical system 13, which includes the terminal optical element 10.

In the present embodiment, the first exposure region PR1 is the projection region of the first optical system PL1, and the second exposure region PR2 is the projection region of the second optical system PL2.

In the present embodiment, the first illumination region IR1 and the first exposure region PR1 are in an optically conjugate positional relationship. In addition, the second illumination region IR2 and the second exposure region PR2 are in an optically conjugate positional relationship. Also, provided in the projection optical system PL of the present embodiment are a first imaging characteristics adjustment apparatus LC1, and a second imaging characteristics adjustment apparatus LC2 that respectively independently adjust the imaging characteristics (image formation state) of the image of the first pattern PA1 and the image of the second pattern PA2 resulting from the projection optical system PL. The first and second imaging characteristics adjustment apparatus LC1, LC2 are controlled by the control apparatus 8. The first and second imaging characteristics adjustment apparatus LC1, LC2 include an optical element drive mechanism that moves at least one of the plurality of optical elements of the projection optical system PL. In the present embodiment, the first imaging characteristics adjustment apparatus LC1 moves at least one specific optical element of the first image forming optical system 14 and, by driving that specific optical element, is able to adjust the imaging characteristics of the image of the first pattern PA1 formed by the first exposure light EL1 irradiated to the first exposure region PR1. In addition, the second imaging characteristics adjustment apparatus LC2 moves at least one specific optical element of the second image forming optical system 17 and, by driving that specific optical element, is able to adjust the imaging characteristics of the image of the second pattern PA2 formed by the second exposure light EL2 irradiated to the second exposure region PR2. Note that exposure apparatus that comprise imaging characteristics adjustment apparatus that adjust the imaging characteristics of images of patterns resulting from a projection optical system PL are disclosed in, for example, U.S. Pat. No. 4,666,273, U.S. Pat. No. 6,235,438, and U.S. Patent Application Publication No. 2005/0206850.

Next, the substrate stage 3 will be described. The substrate stage 3 holds the substrate P and moves within a prescribed region that includes the first exposure region PR1 and the second exposure region PR2. When a shot region on the substrate P is exposed by the first exposure light EL1 irradiated to the first exposure region PR1, the substrate stage 3 moves the shot region on the substrate P in the scanning direction (Y axis directions) to the first exposure region PR1. In addition, when a shot region on the substrate P is exposed by the second exposure light EL2 irradiated to the second exposure region PR2, the substrate stage 3 moves the shot region on the substrate P in the scanning direction (Y axis directions) to the second exposure region PR2.

The substrate stage 3 moves along the guide surface 21 of the base member 20. In the present embodiment, the guide surface 21 is nearly parallel to the XY plane. The substrate stage 3 holds the substrate P and moves within the XY plane along the guide surface 21.

The substrate stage 3 has a substrate holding part 3H that holds the substrate P. The substrate holding part 3H inserts and removes the substrate P. In the present embodiment, the substrate holding part 3H holds the substrate P so that the surface (exposure surface) of the substrate P and the XY plane become nearly parallel. The substrate stage 3 is driven by the substrate stage drive system 3D. The substrate stage drive system 3D includes an actuator such as a linear motor. The substrate stage 3 holds the substrate P and moves within the XY plane by means of actuation of the substrate stage drive system 3D. In the present embodiment, the substrate stage 3 moves in six directions, which are the X axis, Y axis, Z axis, θX, θY and θZ directions, in a state in which the substrate P is held by the substrate holding part 3H.

The substrate stage 3 has an upper surface 3T arranged in the vicinity of the substrate holding part 3H. In the present embodiment, the upper surface 3T of the substrate stage 3 is flat and is nearly parallel with the XY plane. The substrate stage 3 has a recessed part 3C. The substrate holding part 3H is arranged inside the recessed part 3C. In the present embodiment, the upper surface 3T of the substrate stage 3 and the surface of the substrate P held by the substrate holding part 3H are arranged substantially within the same plane (flush). Specifically, the substrate stage 3 holds the substrate P by means of the substrate holding part 3H so that the upper surface 3T and the surface of the substrate P are arranged substantially within the same plane (so as to become flush).

Next, the interferometer system 6 will be described. The interferometer system 6 measures the respective position information of the first mask stage 1, the second mask stage 2 and the substrate stage 3 within the XY plane. The interferometer system 6 comprises a first interferometer unit 6A, which measures position information of the first and second mask stages 1, 2 within the XY plane, and a second interferometer unit 6B, which measures position information of the substrate stage 3 within the XY plane.

The first interferometer unit 6A comprises laser interferometers 22, 23. The first interferometer unit 6A irradiates measuring light to a reflecting surface 1R arranged on the first mask stage 1 by means of laser interferometer 22 and uses the measuring light that has come via that first reflecting surface 1R to measure position information of the first mask stage 1 (first mask M1) in relation to the X axis, Y axis, and θZ directions. In addition, the first interferometer unit 6A irradiates measuring light to a reflecting surface 2R arranged on the second mask stage 2 by means of laser interferometer 23 and uses the measuring light that has come via that reflecting surface 2R to measure position information of the second mask stage 2 (second mask M2) in relation to the X axis, Y axis and θZ directions.

The second interferometer unit 6B comprises a laser interferometer 24. The second interferometer unit 6B irradiates measuring light to a reflecting surface 3R arranged on the substrate stage 3 by means of laser interferometer 24 and uses the measuring light that has come via that reflecting surface 3R to measure position information of the substrate stage 3 (substrate P) in relation to the X axis, Y axis, and θZ directions.

Next, the focus leveling detection system 7 will be described. The focus leveling detection system 7 detects position information of the surface of the substrate P held by the substrate stage 3. The focus leveling detection system 7 detects position information of the surface of the substrate P in relation to the Z axis, θX and θY directions. The focus leveling detection system 7 includes a so-called oblique incidence system multipoint focus leveling detection system such as that disclosed in, for example, U.S. Pat. No. 5,448,332. The focus leveling detection system 7 comprises an irradiation apparatus 7A, which irradiates detection light from a direction inclined with respect to the Z axis direction, and a light receiving apparatus 7B, which receives the detection light that has come via the detection point, with respect to each of the plurality of detection points within the XY plane.

When the substrate P is exposed, position information of the first mask stage 1 is measured by the first interferometer unit 6A. The control apparatus 8 actuates the first mask stage drive system 1D and executes position control of the first mask M1 held by the first mask stage 1 based on the measurement results of the first interferometer unit 6A.

In addition, when the substrate P is exposed, position information of the second mask stage 2 is measured by the first interferometer unit 6A. The control apparatus 8 actuates the second mask stage drive system 2D and executes position control of the second mask M2 held by the second mask stage 2 based on the measurement results of the first interferometer unit 6A.

In addition, when the substrate P is exposed, position information of the substrate stage 3 is measured by the second interferometer unit 6B, and position information of the surface of the substrate P is detected by the focus leveling detection system 7. The control apparatus 8 actuates the substrate stage drive system 3D and executes position control of the substrate P held by the substrate stage 3 based on the measurement results of the second interferometer unit 6B and the measurement results of the focus leveling detection system 7.

Next, the liquid immersion member 9 will be described. The liquid immersion member 9 forms a liquid immersion space LS using a liquid LQ so that at least a part of the optical path of the exposure light EL is filled with the liquid LQ. In the present embodiment, the liquid immersion member 9 is arranged in the vicinity of the terminal optical element 10. The liquid immersion member 9 has a lower surface 9U that opposes the substrate P arranged in the first and second exposure regions PR1, PR2. In the present embodiment, the liquid immersion member 9 forms a liquid immersion space LS so that the optical path of the exposure light EL between the terminal optical element 10 and the substrate P is filled with the liquid LQ. The liquid immersion space LS is formed so that the optical path of the exposure light EL between the exit plane 10U of the terminal optical element 10 and the substrate P is filled with the liquid LQ. In the present embodiment, the liquid immersion space LS is formed between the terminal optical element 10 and the liquid immersion member 9 and the substrate P, which opposes that terminal optical element 10 and liquid immersion member 9. The liquid immersion space LS may also be formed between the terminal optical element 10 and the liquid immersion member 9 and the substrate stage 3, which opposes that terminal optical element 10 and the liquid immersion member 9.

During exposure of the substrate P, the substrate P held by the substrate stage 3 is arranged at a position that opposes the terminal optical element 10 and the liquid immersion member 9. The liquid immersion member 9 forms a liquid immersion space LS by filling the optical path of the exposure light EL between the terminal optical element 10 and the substrate P with a liquid LQ at least at the time of exposure of the substrate P. At least at the time of exposure of the substrate P, the liquid LQ is held between the terminal optical element 10 and the liquid immersion member 9 and the substrate P so that the optical path of the exposure light EL emitted from the exit plane 10U of the terminal optical element 10 is filled with the liquid LQ, and the liquid immersion space LS is formed.

In the present embodiment, a liquid immersion space LS is formed so that a region of a part of the surface of the substrate P that includes the first and second exposure regions PR1, PR2 is covered by the liquid LQ. The interface (meniscus, edge) of the liquid LQ is formed between the lower surface 9U of the liquid immersion member 9 and the surface of the substrate P. Specifically, the exposure apparatus EX of the present embodiment employs a local liquid immersion system.

A detailed description has been omitted, but the liquid immersion member 9 comprises a supply port that supplies the liquid LQ to the optical path of the exposure light EL and a recovery port that recovers the liquid LQ on the substrate P. The supply port is arranged at a prescribed position of the inner circumference surface of the liquid immersion member 9 that faces, for example, the optical path between the terminal optical element 10 and the substrate P. The supply port is able to supply the liquid LQ, which is clean and has been temperature-regulated, in order to form the liquid immersion space LS. The recovery port is arranged at a prescribed position of the lower surface 9U of the liquid immersion member 9 that opposes the surface of the substrate P. In the present embodiment, the control apparatus 8 forms the liquid immersion space LS between the terminal optical element 10 and the liquid immersion member 9 and the substrate P using the liquid LQ by executing a liquid recovery operation that uses the recovery port in parallel with a liquid supply operation that uses the supply port.

Figure 2A:
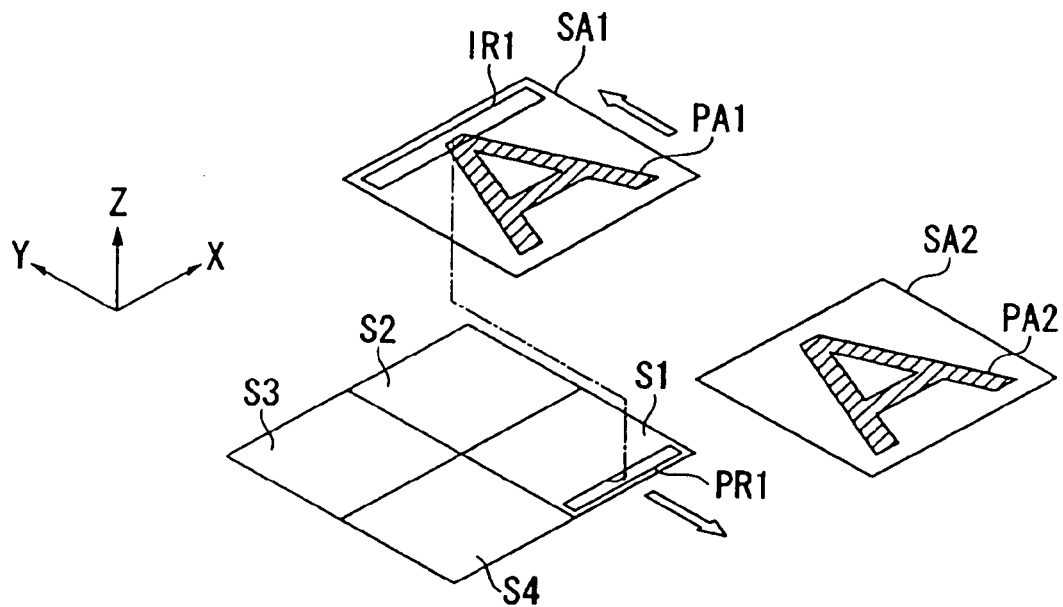
FIGS. 2A and 2B are views that show an example of shot regions on a substrate held by a substrate stage according to the first embodiment.
Figure 2B:
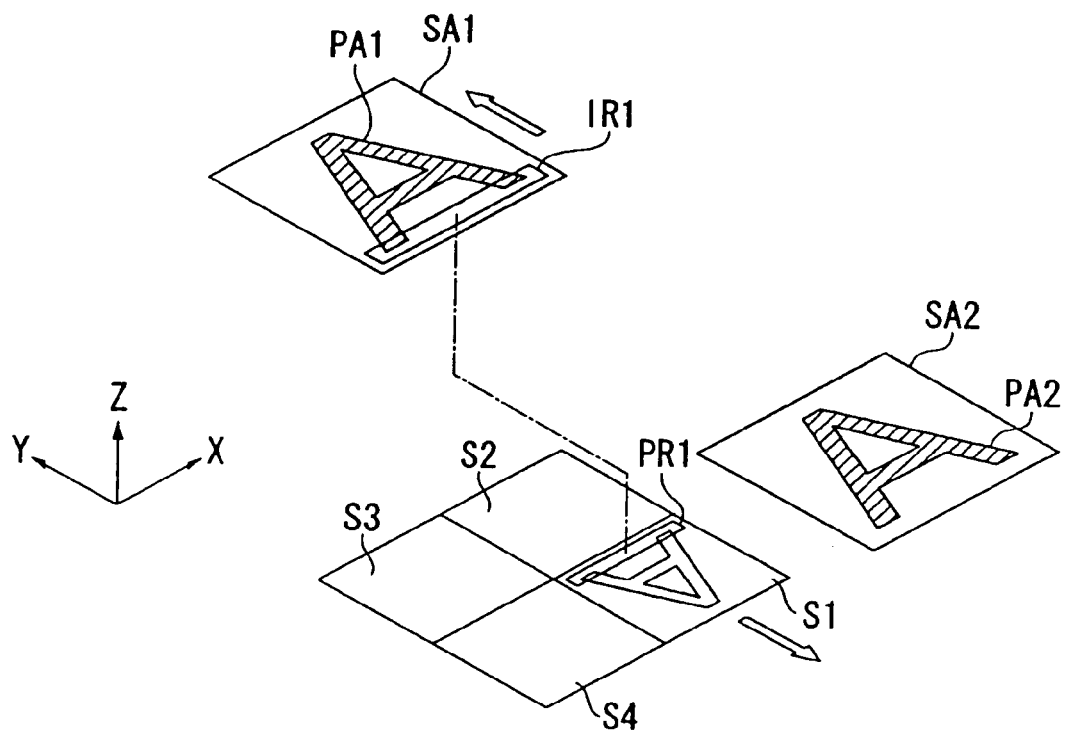

FIGS. 2A and 2B are plan views that show an example of shot regions on a substrate held by the substrate stage 3. A plurality of shot regions S, which are the regions subject to exposure, are provided in a matrix shape on the substrate P. The illustrated arrangement of the shot regions S is just one example.

In the present embodiment, the first exposure region PR1 and the second exposure region PR2 nearly overlap (match) within the visual field of the projection optical system PL. In other words, the first exposure region PR1 and the second exposure region PR2 nearly overlap on the substrate P arranged in the visual field of the projection optical system PL. In addition, in the present embodiment, the first and second exposure regions PR1, PR2 are of a long rectangular shape (slit shape) in the X axis direction. In the present embodiment, the size of the first and second exposure regions PR1, PR2 in the X axis direction and the size of the shot region S in the X axis direction are nearly the same.

Next, an example of an exposure method that uses an exposure apparatus EX that has a configuration such as that discussed above will be described. As discussed above, in the present embodiment, the control apparatus 8 switches between a first exposure mode that includes single patterning processing and a second exposure mode that includes double patterning processing.

Figure 3A:
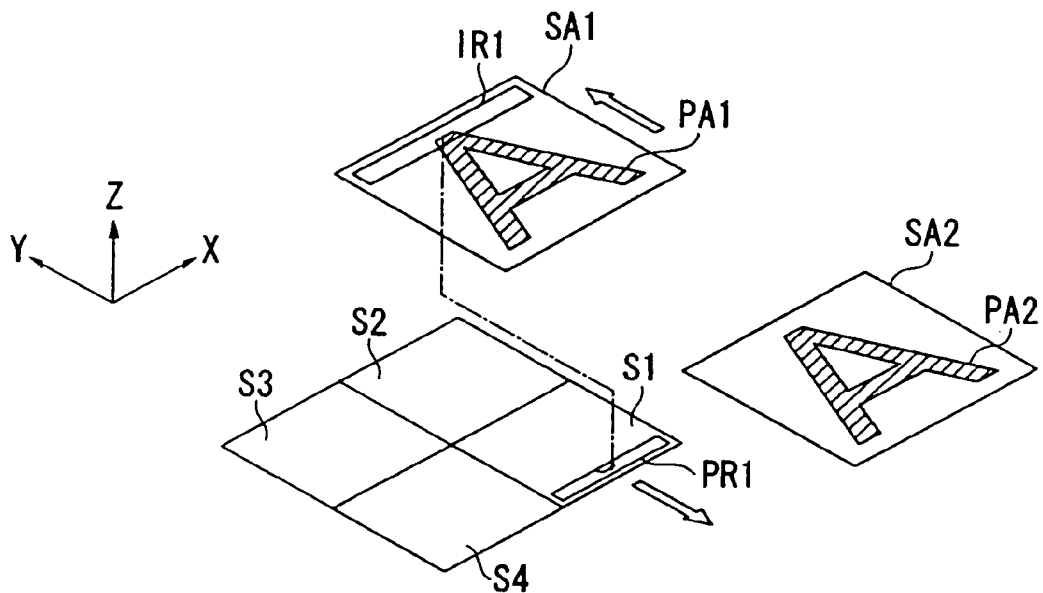
FIGS. 3A and 3B are views for describing an example of the operations of an exposure apparatus according to the first embodiment.

The first exposure mode will be described while referring to the schematic views of FIG. 3A-FIG. 6B. As shown in FIGS. 2A and 2B, a plurality of shot regions S are provided in a matrix shape on the substrate P, and, in the first exposure mode, that plurality of shot regions S is exposed by alternately using the first exposure light EL1 from the first pattern PA1 and the second exposure light EL2 from the second pattern PA2. In the description below, for simplicity, four shot regions S1-S4 that are mutually adjacent will be described with respect to the case in which exposure is performed based on the first exposure mode. As shown in FIGS. 3A and B in the present embodiment, the first shot region S1 and the second shot region S2 are adjacent in relation to the Y axis direction, and the third shot region S3 and the fourth shot region S4 are adjacent in relation to the Y axis direction. In the present embodiment, the first shot region S1 is arranged at the −Y side of the second shot region S2, and the fourth shot region S4 is arranged at the −Y side of the third shot region S3. In addition, the first shot region S1 and the fourth shot region S4 are adjacent in relation to the X axis direction, and the second shot region S2 and the third shot region S3 are adjacent in relation to the X axis direction. In the present embodiment, the first shot region S1 and the second shot region S2 are arranged at the +X side of the third shot region S3 and the fourth shot region S4, respectively.

Figure 3B:
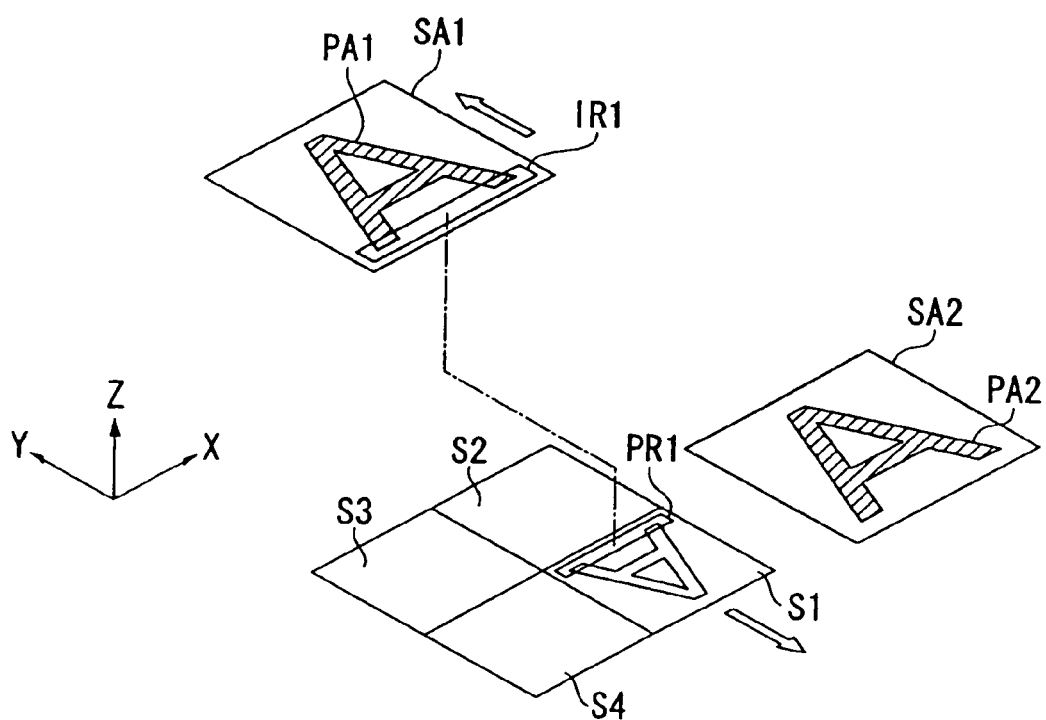

In addition, as shown in FIGS. 3A-3B, in the present embodiment, the first pattern PA1 (first mask M1) and the second pattern PA2 (second mask M2) are arranged in the Y axis direction, and the first pattern PA1 is arranged at the +Y side with respect to the second pattern PA2.

In the present embodiment, the first illumination region IR1 on the first pattern PA1 is of a shape that is long and rectangular (slit shape) in the X axis direction. In addition, the second illumination region IR2 on the second pattern PA2 is also of a shape that is long and rectangular (slit shape) in the X axis direction. In the present embodiment the size of the first illumination region IR1 in the X axis direction and the size of a first pattern formation region SA1 of the first mask M1, on which the first pattern PA1 is formed, in the X axis direction are nearly the same. In addition, the size of the second illumination region IR2 in the X axis direction and the size of a second pattern formation region SA2 of the second mask M2, on which the second pattern PA2 is formed, in the X axis direction are nearly the same.

As shown in FIGS. 3A-3B, in the first exposure mode of the present embodiment, the case was described in which the same pattern was used, but the first pattern PA1 and the second pattern PA2 may also be different patterns. As an example, in the present embodiment, the first pattern PA1 and the second pattern PA2 are patterns that have the shape of the letter "A."

Specifically, in the first exposure mode, a first mask M1 on which the first pattern PA1 comprising the letter "A" is formed is held on a first mask stage 1, and a second mask M2 on which a second pattern PA2 comprising the same letter "A" as the first pattern PA1 is formed is held on a second mask stage 2.

In addition, the projection optical system PL of the present embodiment forms an inverted image, and the control apparatus 8 moves the first mask M1 and second mask M2 and the substrate P in mutually opposite scanning directions (Y axis directions) during exposure of the respective shot regions S1-S4 on the substrate P. For example, in the case in which the control apparatus 8 uses the first and second mask stages 1, 2 to move the first and second masks M1, M2 in the +Y direction, the substrate stage 3 moves the substrate P in the −Y direction, and in the case in which the first and second masks M1, M2 are moved in the −Y direction, the substrate P is moved in the +Y direction.

However, this is a case in which the projection optical system PL forms an inverted image for both the first pattern PA1 and the second pattern PA2, and, for example, in the case in which an inversion optical system is included in only either one of the first image forming optical system 14 and the second image forming optical system 17, and, for example, the projection optical system PL1 forms an inverted image with respect to the first pattern PA1, and the projection optical system PL1 forms an erect image with respect to the second pattern PA2, the control apparatus 8 must be aware of the fact that the first mask M1 and second mask M2 and the substrate P are moved in a scanning direction (Y axis directions) of the same orientation during exposure of the respective shot regions S1-S4 on the substrate P.

In the present embodiment, the control apparatus 8 exposes the respective shot regions S1-S4 in a sequence of the first shot region S1, the second shot region S2, the third shot region S3 and the fourth shot region S4.

In the first exposure mode, the control apparatus 8, when the substrate P is moving in one direction (for example, the −Y direction) with respect to the scanning direction (Y axis directions), moves the first pattern PA1 in a prescribed direction (for example, the +Y direction) in relation to the scanning direction (Y axis directions) relative to the first illumination region IR1 to expose the first shot region S1 on the substrate P using the first exposure light EL1 from the first pattern PA1 irradiated to the first exposure region PR1, then continues movement of the substrate P in the one direction (−Y direction), moves the second pattern PA2 in a specified direction (for example, the +Y direction) in relation to the scanning direction (Y axis directions) to expose the second shot region S2 on the substrate P, and then makes the movement direction of the substrate P the direction that is the reverse of (+Y direction) the one direction and makes the movement direction of the second pattern PA2 the direction that is the reverse of (−Y direction) the specified direction to expose the third shot region S3 on the substrate P using the second exposure light EL2 irradiated to the second exposure region PR2, then continues movement of that substrate P in the reverse direction (+Y direction), and moves the first pattern PA1 in a direction that is the reverse of (for example, the −Y direction) the prescribed direction to expose the fourth shot region S4 on the substrate P using the first exposure light EL1 irradiated to the first exposure region PR1.

An example of the procedure of exposing the first-fourth shot regions S1-S4 will be described below. First, the control apparatus 8 executes a first pattern PA1 preparatory operation for using the first mask stage 1 to expose the first shot region S1 using the first exposure light EL1 from the first pattern PA1.

The preparatory operation includes at least one of an acceleration operation, a deceleration operation and a stoppage operation. In the present embodiment, the preparatory operation of the first pattern PA1 includes a movement operation of the first pattern PA1 (first mask stage 1) for arranging the first pattern PA1 at the exposure start position (scanning start position), and the control apparatus 8 moves the first mask stage 1, which holds the first mask M1, in order to arrange the first pattern PA1 at the exposure start position. The control apparatus 8 executes the first mask stage 1 acceleration operation in order to move the first pattern PA1 to the exposure start position and executes the acceleration operation for the first pattern PA1 to reach a prescribed velocity (velocity for constant velocity movement during scanning exposure) until it enters the first illumination region IR1.

The control apparatus 8 moves the first shot region S1 on the substrate P to the exposure start position in order to expose the first shot region S1 using the first exposure light EL1 from the first pattern PA1.

After the first pattern PA1 and the first shot region S1 have respectively been moved to the exposure start position, the control apparatus 8 controls the first mask stage 1 and the substrate stage 3 to start movement of the first pattern PA1 in the +Y direction and movement of the first shot region S1 in the −Y direction. Then, the first light source apparatus 4 may be controlled so that illumination of the first pattern PA1 by the first exposure light EL1 is started at the point when the edge of the +Y side of the first pattern formation region SA1 has reached the edge of the −Y side of the first illumination region IR1. In addition, setting is performed so that the edge of the −Y side of the first shot region S1 reaches the edge of the +Y side of the first exposure region PR1 at the point when the edge of the +Y side of the first pattern formation region SA1 has reached the first illumination region IR1, and the movable blind of the first optical mechanism BR1 discussed above is controlled so that irradiation of the first exposure light EL1 to the first exposure region PR1 is started. In addition, setting is performed so that the movement velocity of the first pattern PA1 becomes constant at the point when the edge of the +Y side of the first pattern formation region SA1 has reached the edge of the −Y side of the first illumination region IR1 and so that the movement velocity of the first shot region S1 becomes constant at the point when the edge of the −Y side of the first shot region S1 has reached the edge of the +Y side of the first exposure region PR1. FIG. 3A shows a state immediately after the first pattern formation region SA1 and the first shot region S1 have moved from the exposure start position.

Then, the control apparatus 8 uses the first mask stage 1 to move the first pattern PA1 in the +Y direction at a prescribed scanning velocity relative to the first illumination region IR1 for the purpose of scanning exposure of the first shot region S1. The control apparatus 8 moves the first pattern PA1 up to the exposure end position when exposure of the first shot region S1 is to be performed. The control apparatus 8 continues movement of the first pattern PA1 in the +Y direction to consecutively perform illumination of the first pattern PA1 using the first exposure light EL1. By continuing movement of the first pattern PA1 in the +Y direction, the first pattern PA1 passes through the first illumination region IR1.

In addition, the control apparatus 8, synchronously with the movement of the first pattern PA1 in the +Y direction to continue movement of the first shot region S1 in the −Y direction, consecutively performs irradiation of the first exposure light EL1 to the first exposure region PR1, specifically, projection of an image of the first pattern PA1 resulting from the first exposure light EL1 to the first shot region S1. By continuing movement of the first shot region S1 in the −Y direction, the first shot region S1 passes through the first exposure region PR1.

Then, at the point when the edge of the −Y side of the first pattern formation region SA1 has reached the edge of the +Y side of the first illumination region IR1, illumination of the first pattern PA1 by the first illumination light EL1 ends. In addition, at the point when the edge of the −Y side of the first pattern formation region SA1 has reached the edge of the +Y side of the first illumination region IR1, the edge of the +Y side of the first shot region S1 reaches the edge of the −Y side of the first exposure region PR, and at the point when the edge of the +Y side of the first shot region S1 has reached the edge of the −Y side of the first exposure region PR1, irradiation of the first exposure light EL1 to the first exposure region PR1 is stopped. Through this operation, exposure of the first shot region S1 by the first exposure light EL1 irradiated to the first exposure region PR1, specifically, projection of an image of the first pattern PA1 resulting from the first exposure light EL1 irradiated to the first shot region S1, ends. In addition, the first shot region S1 is arranged at the exposure end position. FIG. 3B shows the state immediately prior to the first pattern formation region SA1 and the first shot region S1 respectively moving to the exposure end position.

In this way, the control apparatus 8 synchronously moves the substrate P in the −Y direction while moving the first pattern PA1 in the +Y direction relative to the first illumination region IR1 to which the first exposure light EL1 is irradiated and exposes the first shot region S1 on the substrate P using the first exposure light EL1 from the first pattern PA1. In addition, in the first exposure mode, the second pattern PA2 is not illuminated by the second exposure light EL2 during illumination of the first exposure light EL1 to the first pattern PA1. Specifically, the first illumination system IL1 uses the first exposure light EL1 to illuminate the first pattern PA1 which is moving for the purpose of scanning exposure. In other words, in the first exposure mode, the second pattern PA2 is not passed through the second illumination region IR2 while the first pattern PA1 is being passed through the first illumination region IR1.

The control apparatus 8 starts exposure of the second shot region S2 after exposure of the first shot region S1 has ended. In the present embodiment, after exposure of the first shot region S1 has ended, the first pattern PA1 decelerates and stops and stands by for the next exposure using the first pattern PA1. In the present embodiment, the control apparatus 8 starts the second pattern PA2 preparatory operation for using the second mask stage 2 to expose the second shot region S2 using the second exposure light EL2 from the second pattern PA2 from a time before the first pattern PA1 finishes passing through the first illumination region IR1 and exposure of the first shot region S1 completely ends.

In the present embodiment, the preparatory operation of the second pattern PA2 includes a movement operation of the second pattern PA2 (second mask stage 2) for arranging the second pattern PA2 at the exposure start position, and the control apparatus 8 moves the second mask stage 2, which holds the second mask M2, in order to arrange the second pattern PA2 at the exposure start position. The control apparatus 8 executes the second mask stage 2 acceleration operation in order to move the second pattern PA2 to the exposure start position and executes the acceleration operation for the second pattern PA2 to reach a prescribed velocity (velocity for constant velocity movement during scanning exposure) until it enters the second illumination region IR2.

The control apparatus 8 respectively moves the second pattern PA2 and the second shot region S2 to the exposure start position in order to expose the second shot region S2 using the second exposure light EL2 from the second pattern PA2.

Figure 4A:
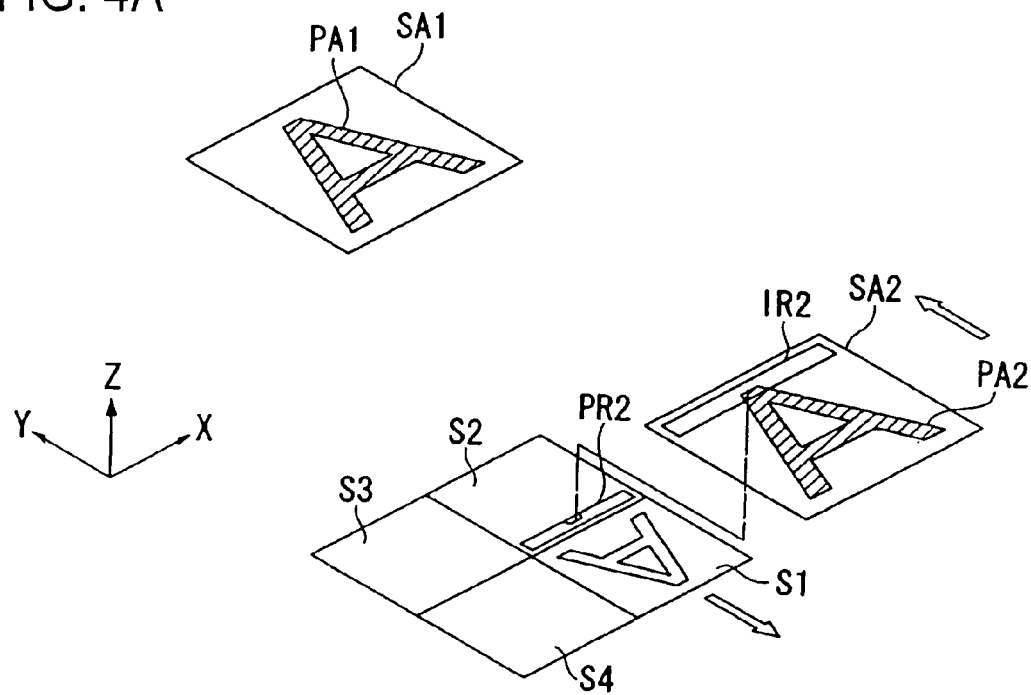
FIGS. 4A and 4B are views for describing an example of the operations of an exposure apparatus according to the first embodiment.

After the second pattern PA2 and the second shot region S2 have respectively moved to the exposure start position, the control apparatus 8 controls the second mask stage 2 and the substrate stage 3 to start movement of the second pattern PA2 in the +Y direction and movement of the second shot region S2 in the −Y direction. In the present embodiment, the control apparatus 8 starts exposure of the second shot region S2 without stopping movement of the substrate P in the −Y direction after exposure of the first shot region S1 has ended. In other words, the control apparatus 8 continues movement of the substrate P in the −Y direction and shifts from the exposure operation with respect to the first shot region S1 to the exposure operation with respect to the second shot region S2. To be exact, the control apparatus 8, following the point when the edge of the −Y side of the first pattern PA1 and the edge of the +Y side of the first illumination region IR1 have become superposed, performs control so that the edge of the +Y side of the second pattern PA2 comes into the edge of the −Y side of the second illumination region IR2 synchronously with the edge of the −Y side of the second shot region S2 on the substrate P, and continues constant velocity movement in the +Y direction even following the exposure operation of the first shot region S comes into the edge of the +Y side of the second exposure region PR2. In this way, illumination of the second pattern PA2 by the second exposure light EL2 starts at the point when the edge of the +Y side of the second pattern formation region SA2 has reached the edge of the −Y side of the second illumination region IR2. In addition, the movable blind of the second optical mechanism BR2 is controlled so that irradiation of the second exposure light EL2 to the second exposure region PR2 is started at the point when the edge of the +Y side of the second pattern formation region SA2 has reached the second illumination region IR2. In addition, setting is performed so that the movement velocity of the second pattern PA2 becomes constant at the point when the edge of the +Y side of the second pattern formation region SA2 has reached the edge of the −Y side of the second illumination region IR2 and so that the movement velocity of the second shot region S2 becomes constant at the point when the edge of the −Y side of the second shot region S2 on the substrate P has reached the edge of the +Y side of the second exposure region PR2. FIG. 4A shows a state immediately after the second pattern formation region SA2 and the second shot region S2 have moved from the exposure start position.

Then, the control apparatus 8 uses the second mask stage 2 to move the second pattern PA2 in the +Y direction at a prescribed scanning velocity relative to the second illumination region IR2 for the purpose of scanning exposure of the second shot region S2. The control apparatus 8 moves the second pattern PA2 up to the exposure end position when the second shot region S2 is to be exposed. The control apparatus 8 consecutively performs illumination (exposure) of the first pattern PA1 resulting from the first exposure light EL1 and illumination (exposure) of the second pattern PA2 resulting from the second exposure light EL2 by continuing movement of the second pattern PA2 in the +Y direction. By continuing movement of the second pattern PA2 in the +Y direction, the second pattern PA2 passes through the second illumination region IR2.

In addition, the control apparatus 8, synchronously with the movement of the second pattern PA2 in the +Y direction to continue movement of the second shot region S2 in the −Y direction, consecutively performs irradiation of the second exposure light EL2 to the second exposure region PR2, specifically, projection of an image of the second pattern PA2 resulting from the second exposure light EL2 to the second shot region S2. By continuing movement of the second shot region S2 in the −Y direction, the second shot region S2 passes through the second exposure region PR2.

Figure 4B:
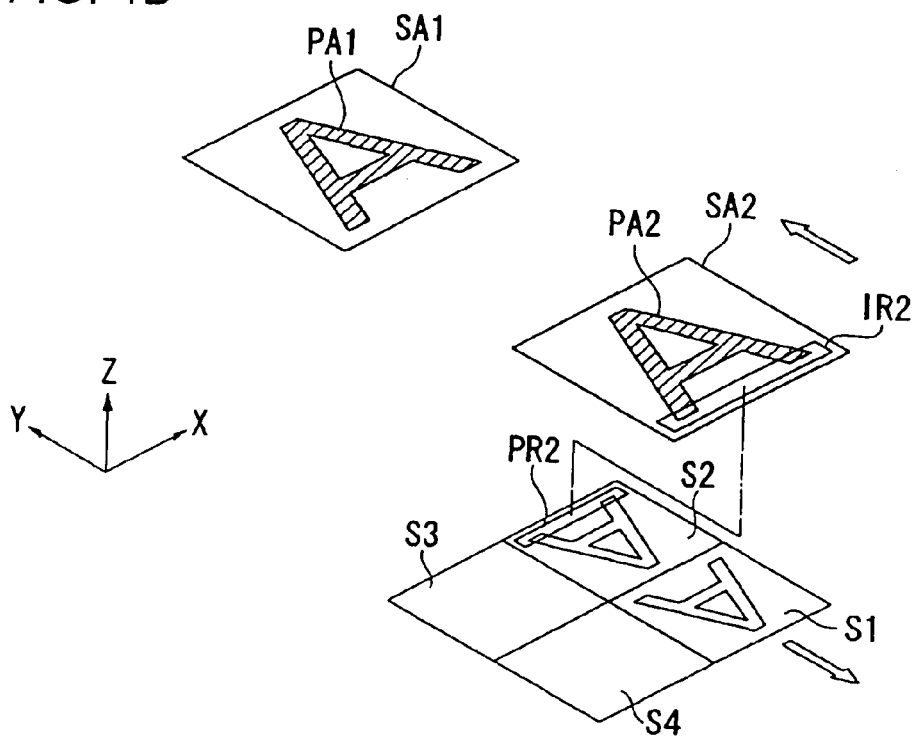

Then, illumination of the second pattern PA2 by the second illumination light EL2 ends at the point when the edge of the −Y side of the second pattern formation region SA2 has reached the edge of the +Y side of the second illumination region IR2. In addition, at this point in time, the edge of the +Y side of the second shot region S2 reaches the edge of the −Y side of the second exposure region PR2, and irradiation of the second exposure light EL2 to the second exposure region PR2 is stopped. Through this operation, exposure of the second shot region S2 by the second exposure light EL2 irradiated to the second exposure region PR2, specifically, projection of an image of the second pattern PA2 resulting from the second exposure light EL2 to the second shot region S2, ends. In addition, the second shot region S2 is arranged at the exposure end position. FIG. 4B shows the state immediately prior to the second pattern formation region SA2 and the second shot region S2 respectively moving to the exposure end position.

In this way, the control apparatus 8 continues movement of the substrate P in the +Y direction even after exposure of the first shot region S1, and synchronously moves the substrate P in the +Y direction while moving the second pattern PA2 in the +Y direction relative to the second illumination region IR2 to which the second exposure light EL2 is irradiated and exposes the second shot region S2 on the substrate P using the second exposure light EL2 from the second pattern PA2.

In the present embodiment, after exposure of the second shot region S2 has ended, the second pattern PA2 decelerates and stops and stands by for the next exposure using the second pattern PA2.

In the present embodiment, the exposure end position of the first shot region S1 and the exposure start position of the second shot region S2 are adjacent, and by continuing movement of the substrate P in the −Y direction after the first shot region S1 has moved to the exposure end position, it is possible to immediately arrange the second shot region S2 at the exposure start position, and the control apparatus 8 is able to immediately start exposure of the second shot region S2 after exposure of the first shot region S1 has ended. Specifically, in the present embodiment, exposure of the first shot region S1 and exposure of the second shot region S2 are consecutively executed. In the present embodiment, the control apparatus 8 moves the substrate P in the −Y direction to expose the first shot region S1 using the first exposure light EL1 from the first pattern PA1, then continues movement of the substrate P in the −Y direction while exposing the second shot region S2 using the second exposure light EL2 from the second pattern PA2. Specifically, in the first exposure mode, even if exposure of the first shot region S1 has ended, the movement direction of the substrate P is not reversed, movement of the substrate P in the −Y direction continues, and exposure of the second shot region S2 is started.

In addition, in the present embodiment, the preparatory operation of the second pattern PA2 is completed before the first pattern PA1 is arranged at the exposure end position when the first shot region S1 is being exposed, and the second pattern PA2 is arranged at the exposure start position when the second shot region S2 is to be exposed. Through this operation, the control apparatus 8 is able to immediately start exposure of the second shot region S2 after exposure of the first shot region S1 has ended.

In addition, in the first exposure mode, the first pattern PA1 is not illuminated by the first exposure light EL1 during illumination of the second exposure light EL2 to the second pattern PA2. Specifically, the second illumination region IR2 uses the second exposure light EL2 to illuminate the second pattern PA2 during movement for scanning exposure. In other words, in the first exposure mode, the first pattern PA1 is not passed through the first illumination region IR1 while the second pattern PA2 is being passed through the second illumination region IR2.

After exposure of the second shot region S2 has ended, the control apparatus 8 sets the movement directions of the substrate P and the second pattern PA2 to the reverse directions and executes the preparatory operation of the second pattern PA2 for exposing the third shot region S3 using the second exposure light EL2 from the second pattern PA2.

In the present embodiment, the second shot region S2 and the third shot region S3 are arranged adjacently in the X axis direction, and the control apparatus 8 controls the substrate stage 3 to step move the substrate P so that the substrate P is arranged at the exposure start position for the third shot region S3 when the third shot region S3 is to be exposed.

In the present embodiment, during the stepping operation of the substrate P, for the second pattern PA2, a preparatory operation for the third shot region S3 exposure operation is performed. Specifically, the control apparatus 8, during the stepping operation of the substrate P, uses the second mask stage 2 to execute the second pattern PA2 preparatory operation for the exposure operation of the third shot region S3.

In the present embodiment, the preparatory operation of the second pattern PA2 includes a second pattern PA2 (second mask stage 2) movement operation for arranging the second pattern PA2 at the exposure start position, and the control apparatus 8 moves the second mask stage 2, which holds the second mask M2, in order to arrange the second pattern PA2 at the exposure start position in parallel with at least a part of the stepping operation of the substrate P. The control apparatus 8 executes a second mask stage 2 acceleration operation for moving the second pattern PA2 to the exposure start position to execute an acceleration operation for the second pattern PA2 to reach a prescribed velocity (a velocity for constant velocity movement during scanning exposure) until it enters the second illumination region IR2.

The control apparatus 8 respectively moves the second pattern PA2 and the third shot region S3 to the exposure start position for exposing the third shot region S3 using the second exposure light EL2 from the second pattern PA2.

Figure 5A:
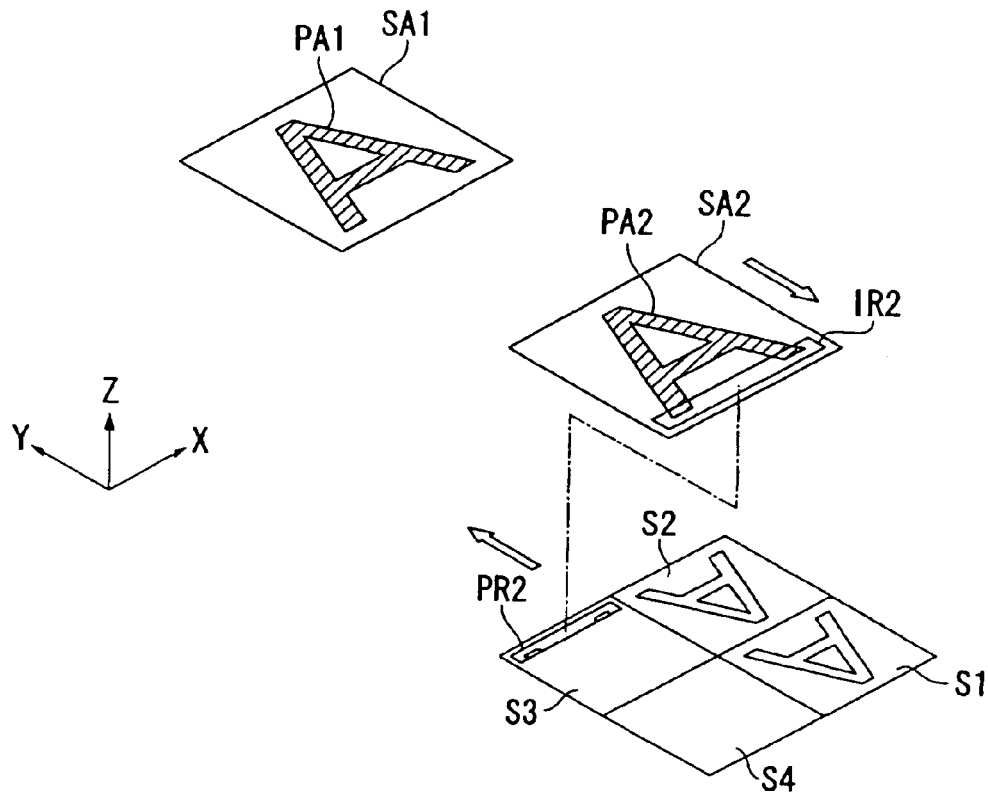
FIGS. 5A and 5B are views for describing an example of the operations of an exposure apparatus according to the first embodiment.

After the second pattern PA2 and the third shot region S3 have respectively moved to the exposure start position, the control apparatus 8 controls the second mask stage 2 and the substrate stage 3 to start movement of the second pattern PA2 in the −Y direction and movement of the third shot region S3 in the +Y direction. Then, the second light source apparatus 5 may be controlled so that illumination of the second pattern PA2 by the second exposure light EL2 starts at the point when the edge of the −Y side of the second pattern formation region SA2 has reached the edge of the +Y side of the second illumination region IR2. In addition, setting is performed so that the edge of the +Y side of the third shot region S3 reaches the edge of the −Y side of the second exposure region PR2 at the point when the edge of the −Y side of the second pattern formation region SA2 has reached the second illumination region IR2, and the movable blind of the second optical mechanism BR2 discussed above is controlled so that irradiation of the second exposure light EL2 to the second exposure region PR2 is started. In addition, setting is performed so that the movement velocity of the second pattern PA2 becomes constant at the point when the edge of the −Y side of the second pattern formation region SA2 has reached the edge of the +Y side of the second illumination region IR2, and the movement velocity of the third shot region S3 becomes constant at the point when the edge of the +Y side of the third shot region S3 has reached the edge of the −Y side of the second exposure region PR2. FIG. 5A shows the state immediately after the second pattern formation region SA2 and the third shot region S3 have moved from the exposure start position.

Then, the control apparatus 8 uses the second mask stage 2 to move the second pattern PA2 in the −Y direction at a prescribed scanning velocity relative to the second illumination region IR2 for the purpose of scanning exposure of the third shot region S3. The control apparatus 8 moves the second pattern PA2 up to the exposure end position when the third shot region S3 is exposed. The control apparatus 8 consecutively performs illumination of the second pattern PA2 by the second exposure light EL2 by continuing movement of the second pattern PA2 in the −Y direction. The second pattern PA2 passes through the second illumination region IR2 by continuing movement of the second pattern PA2 in the −Y direction.

In addition, the control apparatus 8, by synchronously moving the second pattern PA2 in the −Y direction while moving the third shot region S3 in the +Y direction, consecutively performs irradiation of the second exposure light EL2 to the second exposure region PR2, specifically, projection of an image of the second pattern PA2 resulting from the second exposure light EL2 to the third shot region S3. The third shot region S3 passes through the second exposure region PR by continuing movement of the third shot region S3 in the +Y direction.

Figure 5B:
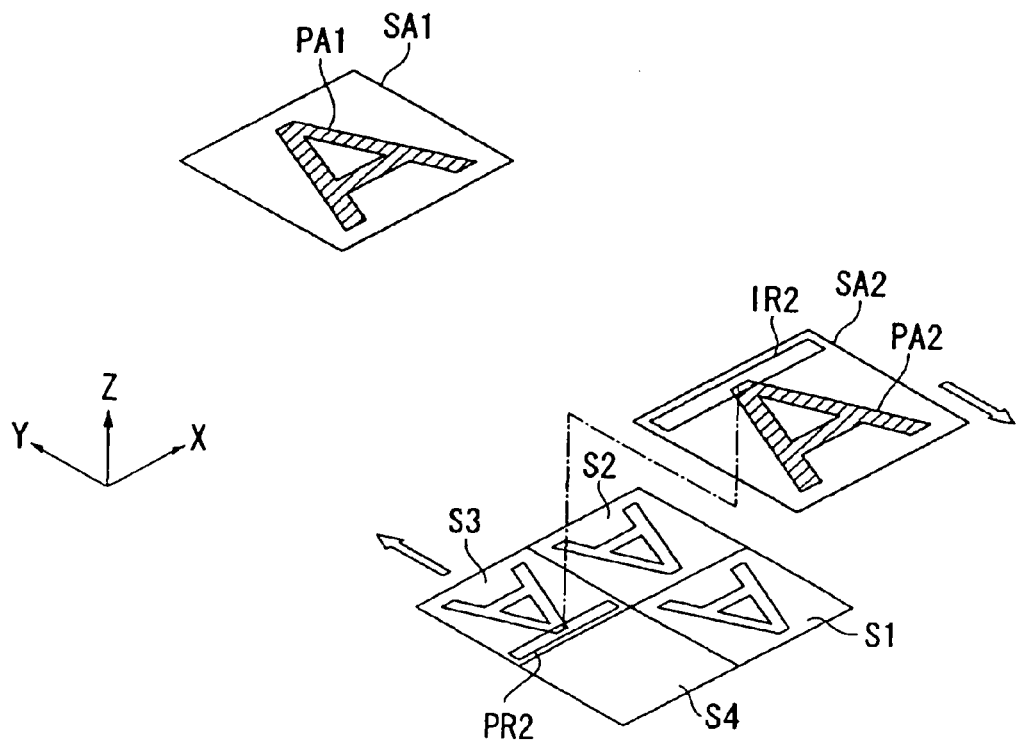

Then, illumination of the second pattern PA2 by the second exposure light EL2 ends at the point when the edge of the +Y side of the second pattern formation region SA2 has reached the edge of the −Y side of the second illumination region IR2. In addition, the edge of the −Y side of the third shot region S3 reaches the edge of the +Y side of the second exposure region PR2 at the point when the edge of +Y side of the second pattern formation region SA2 has reached the edge of the −Y side of the second illumination region IR2, and irradiation of the second exposure light EL2 to the second exposure region PR2 is stopped at the point when the edge of the −Y side of the third shot region S3 has reached the edge of the +Y side of the second exposure region PR2. Through this operation, exposure of the third shot region S3 by the second exposure light EL2 irradiated to the second exposure region PR2, specifically, projection of an image of the second pattern PA2 resulting from the second exposure light EL2 to the third shot region S3, ends. In addition, the third shot region S3 is arranged at the exposure end position. FIG. 5B shows a state immediately prior to the second pattern formation region SA2 and the third shot region S3 respectively moving to the exposure end position.

In this way, the control apparatus 8, after having exposed the second shot region S2 using the second exposure light EL2, makes the respective movement directions of the substrate P and the second pattern PA2 reverse, and synchronously moves the substrate P in the reverse direction while moving the second pattern PA2 in the reverse direction to expose the third shot region S3 on the substrate P using the second exposure light EL2 from the second pattern PA2. Even when the third shot region S3 is being exposed, the first pattern PA1 is not illuminated by the first exposure light EL1 during illumination of the second exposure light EL2 to the second pattern PA2.

The control apparatus 8, after having ended exposure of the third shot region S3, starts exposure of the fourth shot region S4. In the present embodiment, after exposure of the third shot region S3 has ended, the second pattern PA2 decelerates and stops and stands by for the next exposure using second pattern PA2. In the present embodiment, the control apparatus 8 starts the preparatory operation of the first pattern PA1 for using the first mask stage 1 to expose the fourth shot region S4 using the first exposure light EL1 from the first pattern PA1 from a time before the second pattern PA2 has finished passing through the second illumination region IR2 and exposure of the third region S3 has completely ended. This first pattern has decelerated and stopped and has gone into a standby status after the preceding exposure of the first shot region S1 ended.

In the present embodiment, the preparatory operations of the first pattern PA1 include the movement operation of the first pattern PA1 (first mask stage 1) for arranging the first pattern PA1 at the exposure start position, and the control apparatus 8 moves the first mask stage 1, which holds the first mask M1, in order to arrange the first pattern PA1 at the exposure start position. The control apparatus 8 executes the first mask stage 1 acceleration operation in order to move the first pattern PA1 to the exposure start position and execute an acceleration operation for the first pattern PA1 to reach a prescribed velocity (a velocity for constant velocity movement during scanning exposure) until it enters the first illumination region IR1.

The control apparatus 8 respectively moves the first pattern PA1 and the fourth shot region S4 to the exposure start position in order to expose the fourth shot region S4 using the first exposure light EL1 from the first pattern PA1.

Figure 6A:
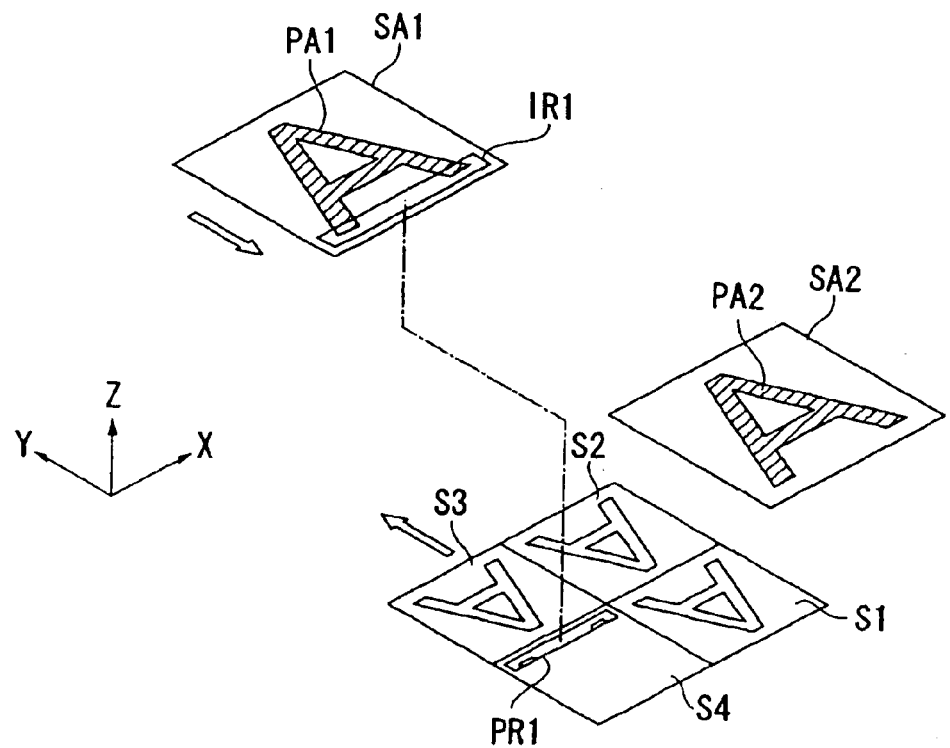
FIGS. 6A and 6B are views for describing an example of the operations of an exposure apparatus according to the first embodiment.

After the first pattern PA1 and the fourth shot region S4 have respectively been moved to the exposure start position, the control apparatus 8 controls the first mask stage 1 and the substrate stage 3 to start movement of the first pattern PA1 in the −Y direction and movement of the fourth shot region S4 in the +Y direction. In the present embodiment, the control apparatus 8, after the end of exposure of the third shot region S3, starts exposure of the fourth shot region S4 without stopping movement of the substrate P in the +Y direction. In other words, the control apparatus 8 continues movement of the substrate P in the +Y direction and shifts from the exposure operation with respect to the third shot region S3 to the exposure operation with respect to the fourth shot region S4. To be exact, the control apparatus 8, following the point when the edge of the +Y side of the second pattern PA2 has become superposed with the edge of the −Y side of the second illumination region IR2, performs control so that the edge of the −Y side of the first pattern PA1 comes into the edge of the +Y side of the first illumination region IR1 synchronously with the edge of the +Y side of the fourth shot region S4 on the substrate P, and continues constant velocity movement in the −Y direction even after the exposure operation of the third shot region S3 comes into the edge of the −Y side of the second exposure region PR2. In this way, illumination of the first pattern PA1 by the first exposure light EL1 is started at the point when the edge of the −Y side of the first pattern formation region SA1 has reached the edge of the +Y of the first illumination region IR1. In addition, setting is performed so that the edge of the +Y side of the fourth shot region S4 reaches the edge of the −Y side of the first exposure region PR1 at the point when the edge of the −Y side of the first pattern formation region SA1 has reached the first illumination region IR1, and the movable blind of the first optical mechanism BR1 is controlled so that irradiation of the first exposure light EL1 to the first exposure region PR1 is started. In addition, the movement velocity of the first pattern PA1 becomes constant at the point when the edge of the −Y side of the first pattern formation region SA1 has reached the edge of the +Y side of the first illumination region IR1, and setting is performed so that the movement velocity of the fourth shot region S4 becomes constant at the point when the edge of the +Y side of the fourth shot region S4 has reached the edge of the −Y side of the first exposure region PR1. FIG. 6A shows a state immediately after the first pattern formation region SA1 and the fourth shot region S4 have moved from the exposure start position.

Then, the control apparatus 8 uses the first mask stage 1 to move the first pattern PA1 in the −Y direction at a prescribed scanning velocity relative to the first illumination region IR1 for the purpose of scanning exposure of the fourth shot region S4. The control apparatus 8 moves the first pattern PA1 up to the exposure end position when the fourth shot region S4 is being exposed. The control apparatus 8 consecutively performs illumination (exposure) of the second pattern PA2 by the second exposure light EL2 and illumination (exposure) of the first pattern PA1 by the first exposure light EL1 without inserting a stepping operation between exposure of the third shot region S3 and exposure of the fourth shot region S4 by continuing movement of the first pattern PA1 in the −Y direction. By continuing movement of the first pattern PA1 in the −Y direction, the first pattern PA1 passes through the first illumination region IR1.

In addition, the control apparatus 8, synchronously with the movement of the first pattern PA1 in the −Y direction to continue movement of the fourth shot region S4 in the +Y direction, consecutively performs irradiation of the first exposure light EL1 to the first exposure region PR1, specifically, projection of an image of the first pattern PA1 resulting from the first exposure light EL1 to the fourth shot region S4. By continuing movement of the fourth shot region S4 in the +Y direction, the fourth shot region S4 passes through the first exposure region PR1.

Figure 6B:
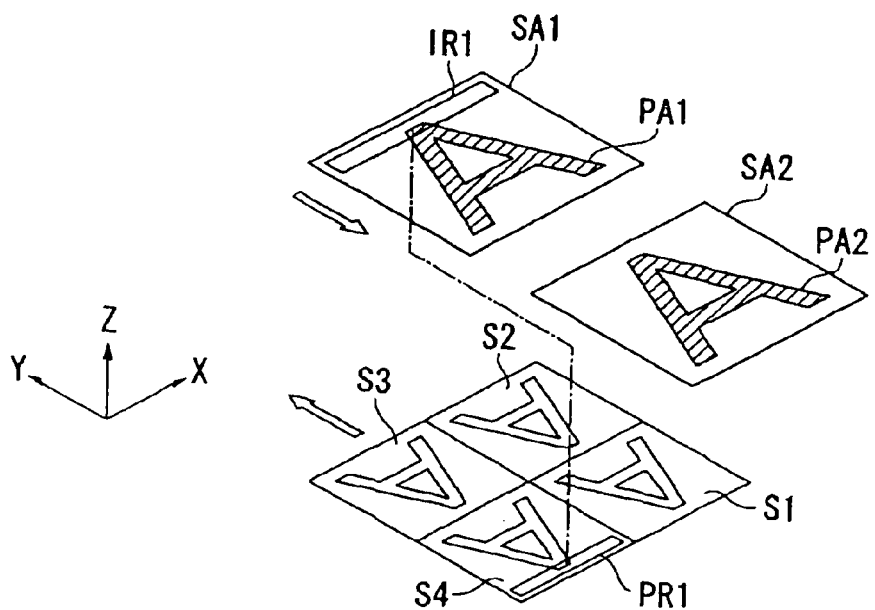

Then, illumination of the first pattern PA1 by the first exposure light EL1 ends at the point when the edge of the +Y side of the first pattern formation region SA1 has reached the edge of the −Y side of the first illumination region IR1. In addition, at this point, the edge of the −Y side of the fourth shot region S4 reaches the edge of the +Y side of the first exposure region PR1, and irradiation of the first exposure light EL1 to the first exposure region PR1 is stopped. Through this operation, exposure of the fourth shot region S4 by the first exposure light EL1 irradiated to the first exposure region PR1, specifically, projection of an image of the first pattern PA1 resulting from this first exposure light EL1 to the fourth shot region S4, ends. Also, the fourth shot region S4 is arranged at the exposure end position. FIG. 6B shows the status immediately prior to the first pattern formation region SA1 and the fourth shot region S4 respectively move to the exposure end position.

In this way, the control apparatus 8 continues movement of the substrate P in the +Y direction even after exposure of the third shot region S3, synchronously moves the substrate P in the +Y direction while moving the first pattern PA1 in the −Y direction relative to the first illumination region IR1 to which the first exposure light EL1 is irradiated and expose the fourth shot region S4 on the substrate P using the first exposure light EL1 from the first pattern PA1.

In the present embodiment, after exposure of the fourth shot region S4 has ended, the first pattern PA1 decelerates and stops and stands by for the next exposure using the first pattern PA1.

In the present embodiment, the exposure end position of the third shot region S3 and the exposure start position of the fourth shot region S4 are adjacent, and by continuing movement of the substrate P in the +Y direction after the third shot region S3 has moved to the exposure end position, it is possible to immediately arrange the fourth shot region S4 at the exposure start position, and the control apparatus 8 is able to immediately start exposure of the fourth shot region S4 after exposure of the third shot region S3 is ended. Specifically, in the present embodiment, exposure of the third shot region S3 and exposure of the fourth shot region S4 can be consecutively executed. In the present embodiment, the control apparatus 8 moves the substrate P in the +Y direction to expose the third shot region S3 using the second exposure light EL2 from the second pattern PA2, and then continues movement of that substrate P in the +Y direction while exposing the fourth shot region S4 using the first exposure light EL1 from the first pattern PA1. Specifically, in the first exposure mode, even though exposure of the third shot region S3 has ended, the movement direction of the substrate P is not reversed, movement of the substrate P in the +Y direction is continued, and exposure of the fourth shot region S4 is started. In other words, in the first mode, it is possible to consecutively expose the third shot region S3 and the fourth shot region S4 without inserting a stepping operation between exposure of the third shot region S3 and exposure of the fourth shot region S4, so throughput is improved.

In addition, in the present embodiment, the first pattern PA1 decelerates and stops after being used in exposure of the first shot region S1, goes into a standby state, and then the scanning direction of the first pattern PA1 at the time of exposure of the fourth shot region S4 in which the first pattern PA1 is used is the same as the scanning direction when the second pattern PA2 exposes the third shot region S3, so the preparatory operation of the first pattern PA1 is completed before the second pattern PA2 is arranged at the exposure end position when the third shot region S3 is being exposed, and the first pattern PA1 is arranged at the exposure start position when the fourth shot region S4 is to be exposed. Through this operation, the control apparatus 8 is able to start exposure of the fourth shot region S4 immediately after exposure of the third shot region S3 has ended.

Above, an example of the procedure of exposing the first-fourth shot regions S1-S4 was described. A plurality of shot regions S are provided on the substrate P, and the control apparatus 8 sequentially exposes the respective shot regions S based on the procedure discussed above. In the first exposure mode, projection of the first and second patterns PA1, PA2 is performed by the first and second masks' M1, M2 moving in one direction and moving in the reverse direction respectively.

Figure 7A:
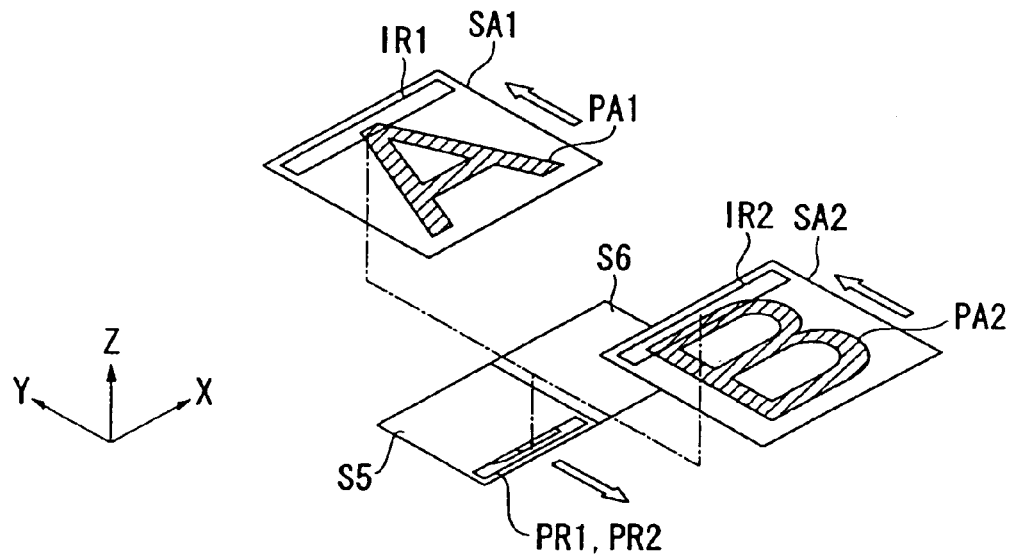
FIGS. 7A and 7B are views for describing an example of the operations of an exposure apparatus according to the first embodiment.
Figure 7B:
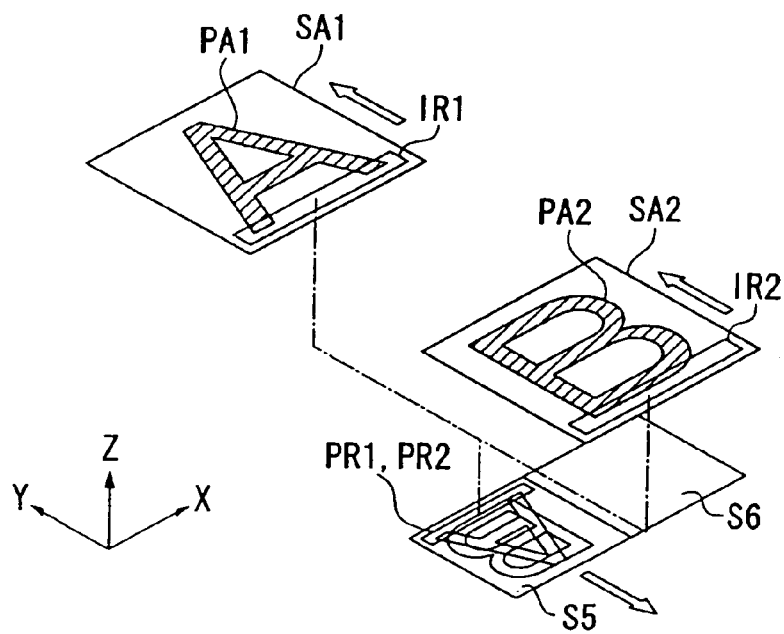

Next, the second exposure mode will be described while referring to the views of FIGS. 7A-B and FIGS. 8A-B. In the following description, for simplicity, two shot regions S5, S6 that are mutually adjacent will be described with respect to the case in which exposure is performed based on the second exposure mode. In FIGS. 7A-B, the fifth shot region S5 and the sixth shot region S6 are adjacent in relation to the X axis direction. In the present embodiment, the fifth shot region S5 is arranged at the −X side of the sixth shot region S6.

In addition, as shown in FIG. 7, the first pattern PA1 (first mask M1) and the second pattern PA2 (second mask M2) are arranged in the Y axis direction, and the first pattern PA1 is arranged at the +Y side with respect to the second pattern PA2.

As shown in FIGS. 7A-7B, in the second exposure mode, the first pattern PA1 and the second pattern PA2 are different patterns. As an example, the first pattern PA1 is a pattern that has the shape of the letter "A," and the second pattern is a pattern that has the shape of the letter "B."

Specifically, in the second exposure mode, the first mask M1, on which the first pattern PA1 comprising the letter "A" is formed, is held on the first mask stage 1, and the second mask M2, on which the second pattern PA2 comprising the letter "B," which is different from the first pattern PA1, is formed, is held on the second mask stage 2.

In the present embodiment, the control apparatus 8 exposes (multiply exposes) the sixth shot region S6 after the fifth shot region S5 is exposed (multiply exposed).

In the second exposure mode, the control apparatus 8, when the substrate P is moving in one direction (for example, the −Y direction) in relation to the scanning direction (Y axis directions), respectively moves the first pattern PA1 and the second pattern PA2 in a prescribed direction (for example, the +Y direction) in relation to the scanning direction (Y axis directions) relative to the first illumination region IR1 and the second illumination region IR2 to multiply expose the fifth shot region S5 using the first exposure light EL1 from the first pattern PA1 irradiated to the first exposure region PR1 and the second exposure light EL2 from the second pattern PA2 irradiated to the second exposure region PR2, then respectively makes the movement directions of the substrate P and the first pattern PA1 and second pattern PA2 reverse to multiply expose the sixth shot region S6 using the first exposure light EL1 from the first pattern PA1 irradiated to the first exposure region PR1 and the second exposure light EL2 from the second pattern PA2 irradiated to the second exposure region PR2 when the substrate P is moving in the reverse direction (+Y direction).

An example of the procedure of exposing the fifth and sixth shot regions S5, S6 will be described below. First, the control apparatus 8 respectively moves the first pattern PA1, the second pattern PA2 and the fifth shot region S5 to the exposure start position (scanning start position) in order to multiply expose the fifth shot region S5 using the first exposure light EL1 from the first pattern PA1 and the second exposure light EL2 from the second pattern PA2.

After the first pattern PA1, the second pattern PA2 and the fifth shot region S5 have respectively been moved to the exposure start position (scanning start position), the control apparatus 8 controls the first mask stage 1, the second mask stage 2 and the substrate stage 3 to start movement of the first pattern PA1 in the +Y direction, movement of the second pattern PA2 in the +Y direction, and movement of the fifth shot region S5 in the −Y direction. Then, illumination of the first pattern PA1 by the first exposure light EL1 is started at the point when the edge of the +Y side of the first pattern formation region SA1 has reached the edge of the −Y side of the first illumination region IR1, and the respective movable blinds of the first optical mechanism BR1 and the second optical mechanism BR2 are controlled so that illumination of the second pattern PA2 by the second exposure light EL2 is started at the point when the edge of the +Y side of the second pattern formation region SA2 has reached the edge of the −Y side of the second illumination region IR2. In addition, the light source may also be controlled at this time. Also, in the present embodiment, the first exposure region PR1 and the second exposure region PR2 nearly overlap, and setting is performed so that the edge of the −Y side of the fifth shot region S5 reaches the edges of the +Y sides of the first and second exposure regions PR1, PR2 at the point when the edges of the +Y sides of the first and second pattern formation regions SA1, SA2 have reached the first and second illumination regions IR1, IR2.

Then, the control apparatus 8 uses the first mask stage 1 and the second mask stage 2 to move the first pattern PA1 in the +Y direction at a prescribed scanning velocity relative to the first illumination region IR1 and to move the second pattern PA2 in the +Y direction at a prescribed scanning velocity relative to the second illumination region IR2 for the purpose of multiple exposure of the fifth shot region S5. The control apparatus 8 respectively moves the first pattern PA1 and the second pattern PA2 up to the exposure end position (scanning end position) when the fifth shot region S5 is being exposed. By continuing movement of the first pattern PA1 in the +Y direction, the first pattern PA1 passes through the first illumination region IR1, and by continuing movement of the second pattern PA2 in the +Y direction, the second pattern PA2 passes through the second illumination region IR2.

In addition, the control apparatus 8, by synchronously moving the first pattern PA1 and the second pattern PA2 in the +Y direction while moving the fifth shot region S5 in the −Y direction, consecutively performs irradiation of the first exposure light EL1 to the first exposure region PR1, specifically, projection of an image of the first pattern PA1 resulting from the first exposure light EL1 to the fifth shot region S5 while simultaneously performing irradiation of the second exposure light EL2 to the second exposure region PR2, specifically, projection of an image of the second pattern PA2 resulting from the second exposure light EL2 to the fifth shot region S5. By continuing movement of the fifth shot region S5 in the −Y direction, the fifth shot region S5 passes through the first exposure region PR1 and the second exposure region PR2.

Then, illumination of the first pattern PA1 by the first exposure lights EL1 ends at the point when the edge of the −Y side of the first pattern formation region SA1 has reached the edge of the +Y side of the first illumination region IR1, and the respective movable blinds of the first optical mechanism BR1 and the second optical mechanism BR2 are controlled so that illumination of the second pattern PA2 by the second exposure light EL2 ends at the point when the edge of the −Y side of the second pattern formation region SA2 has reached the edge of the +Y side of the second illumination region IR2. At this time, the first light source apparatus 4 and the second light source apparatus 5 may respectively be controlled to turn on and off. In addition, the edge of the +Y side of the fifth shot region S5 reaches the edges of the −Y sides of the first and second exposure regions PR1, PR2 at the point when the edge of the −Y side of the first pattern formation region SA1 has reached the edge of the +Y side of the first illumination region IR1, and the edge of the −Y side of the second pattern formation region SA2 has reached the edge of the −Y side of the second illumination region IR2. In addition, irradiation of the first and second exposure lights EL1, EL2 to the first and second exposure regions PR1, PR2 stops at the point when the edge of the +Y side of the fifth shot region S5 has reached the edges of the −Y sides of the first and second exposure regions PR1, PR2. Through this operation, exposure of the fifth shot region S5 by the first and second exposure lights EL1, EL2 irradiated to the first and second exposure regions PR1, PR2, specifically, projection of images of the first and second patterns PA1, PA2 resulting from the first and second exposure lights EL1, EL2 to the fifth shot region S5, ends. In addition, the fifth shot region S5 is arranged at the exposure end position. FIG. 7B shows the state immediately prior to the first pattern formation region SA1, the second pattern formation region SA2 and the fifth shot region S5 respectively move to the exposure end position.

After exposure of the fifth shot region S5 has ended, the control apparatus 8 decelerates the respective movement operations of the substrate P, the first pattern PA1 and the second pattern PA2 and enters into the subsequent exposure operation of the sixth shot region S6 in which the respective movement directions are made the reverse directions. First, the control apparatus 8 performs an operation for moving the first pattern PA1 and the second pattern PA2 to the exposure start position (scanning start position) in order to multiply expose the sixth shot region S6 using the first and second exposure lights EL1, EL2 from the first and second patterns PA1, PA2.

In the present embodiment, the fifth shot region S5 and the sixth shot region S6 are adjacently arranged in the X axis direction, and the control apparatus 8 controls the substrate stage 3 to step move the substrate P in the −X direction. Through this operation, the sixth shot region S6 is arranged at the exposure start position.

Figure 8A:
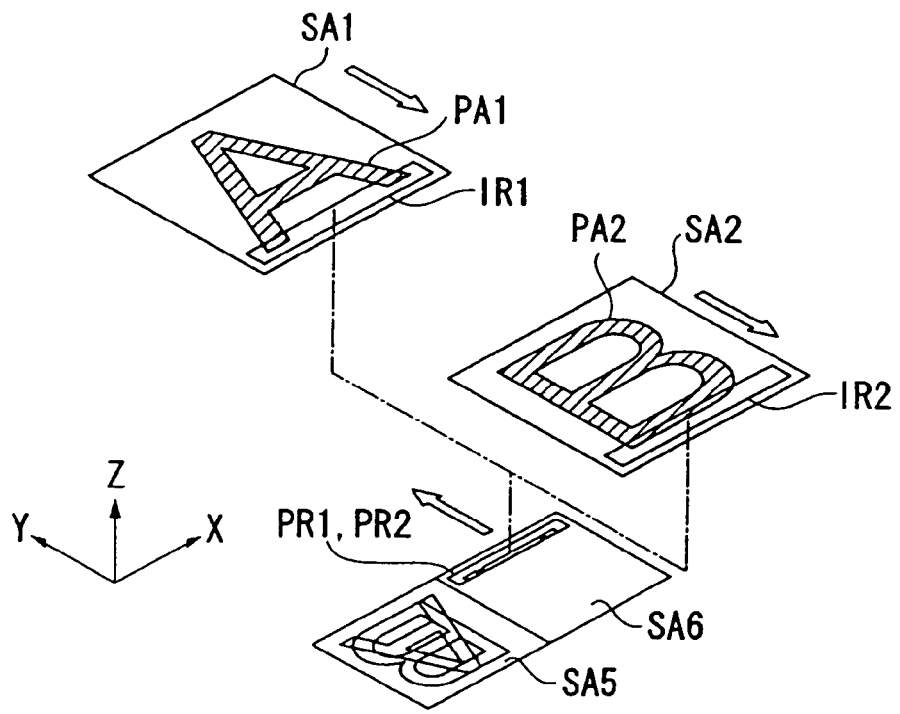
FIGS. 8A and 8B are views for describing an example of the operations of an exposure apparatus according to the first embodiment.

After the first pattern PA1, the second pattern PA2 and the sixth shot region S6 have respectively moved to the exposure start position (scanning start position), the control apparatus 8 controls the first mask stage 1, the second mask stage 2 and the substrate stage 3 to start movement of the first pattern PA1 in the −Y direction, movement of the second pattern PA2 in the −Y direction and movement of the sixth shot region S6 in the +Y direction, which is the opposite of when the fifth shot region S5 was exposed. Then, illumination of the first pattern PA1 by the first exposure light EL1 is started at the point when the edge of the −Y side of the first pattern formation region SA1 has reached the edge of the +Y side of the first illumination region IR1, and control of the second light source apparatus 5 may be performed so that illumination of the second pattern PA2 by the second exposure light EL2 is started at the point when the edge of the −Y side of the second pattern formation region SA2 has reached the edge of the +Y side of the second illumination region IR2. In addition, setting is performed so that the edge of the +Y side of the sixth shot region S6 reaches the edges of the −Y sides of the first and second exposure regions PR1, PR2 at the point when the edge of the −Y side of the first pattern formation region SA1 has reached the first illumination region IR1, and the edge of the −Y side of the second pattern formation region SA2 has reached the second illumination region IR2, and the respective movable blinds of the first optical mechanism BR1 and the second optical mechanism BR2 are controlled so that irradiation of the first and second exposure lights EL1, EL2 to the first and second exposure regions PR1, PR2 starts. In addition, the movement velocities of the first and second patterns PA1, PA2 become constant at the point when the edges of the −Y sides of the first and second pattern formation regions SA1, SA2 have reached the edges of the +Y sides of the first and second illumination regions IR1, IR2, and setting is performed so that the movement velocity of the sixth shot region S6 becomes constant at the point when the edge of the +Y side of the sixth shot region S6 has reached the edges of the −Y sides of the first and second exposure regions PR1, PR2. FIG. 8A shows a state immediately after the first pattern formation region SA1, the second pattern formation region SA2 and the third shot region S3 have moved from the exposure start position.

Then, the control apparatus 8 uses the first mask stage 1 to move the first pattern PA1 in the −Y direction at a prescribed scanning velocity relative to the first illumination region IR1 and uses the second mask stage 2 to move the second pattern PA2 in the −Y direction at a prescribed standing velocity relative to the second illumination region IR2 for the purpose of scanning exposure of the sixth shot region S6. The control apparatus 8 moves the first and second patterns PA1, PA2 up to the exposure end position (scanning end position) when the sixth shot region S6 is being exposed.

In addition, the control apparatus 8, by synchronously moving the first pattern PA1 and the second pattern PA2 in the −Y direction while moving the sixth shot region S6 in the +Y direction, simultaneously performs irradiation of the first exposure light EL1 to the first exposure region PR1, specifically, projection of an image of the first pattern PA1 resulting from the first exposure light EL1 to the sixth shot region S6, and irradiation of the second exposure light EL2 to the second exposure region PR2, specifically, projection of an image of the second pattern PA2 resulting from the second exposure light EL2 to the sixth shot region S6. By continuing movement of the sixth shot region S6 in the +Y direction, the sixth shot region S6 passes through the first and second exposure regions PR1, PR2.

Figure 8B:
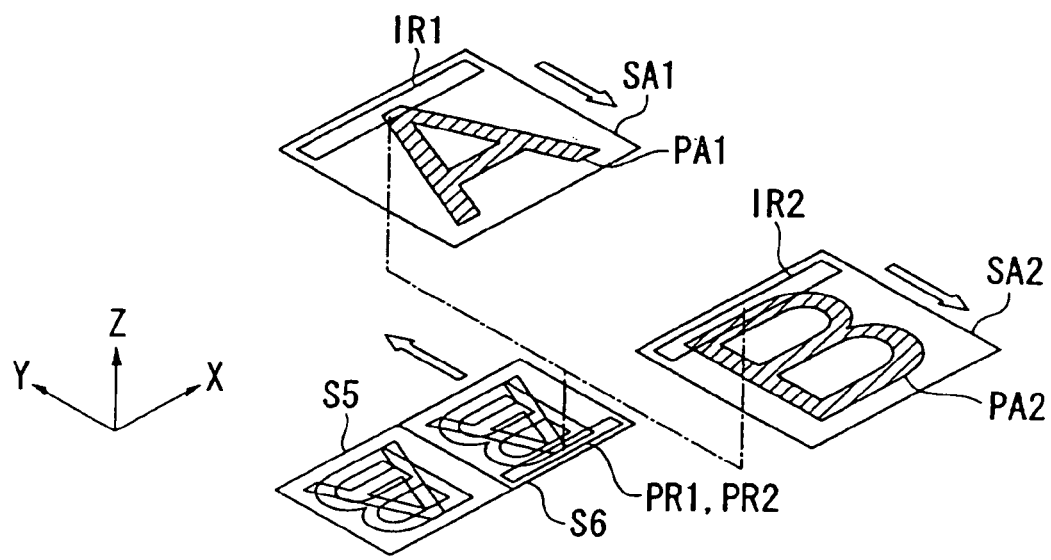

Then, illumination of the first pattern PA1 by the first exposure light EL1 and illumination of the second pattern PA2 by the second exposure light EL2 ends at the point when the edge of the +Y side of the first pattern formation region SA1 has reached the edge of the −Y side of the first illumination region IR1, and the edge of the +Y side of the second pattern region SA2 has reached the edge of the −Y side of the second illumination region IR2. In addition, the movable blinds of the first optical mechanism BR1 and the second optical mechanism BR2 are respectively controlled so that the edge of the −Y side of the sixth shot region S6 reaches the edges of the +Y sides of the first and second exposure regions PR1, PR2, and irradiation of the first and second exposure lights EL1, EL2 to the first and second exposure regions PR1, PR2 is stopped at the point when the edge of the +Y side of the first pattern formation region SA1 has reached the edge of the −Y side of the first illumination region IR1, and the edge of the +Y side of the second pattern formation region SA2 has reached the edge of the −Y side of the second illumination region IR2. Through this operation, exposure of the sixth shot region S6 by the first and second exposure lights EL1, EL2 irradiated to the first and second exposure regions PR1, PR2, specifically, projection of images of the first and second patterns PA1, PA2 resulting from the first and second exposure light EL1, EL2 to the sixth shot region S6, ends. In addition, the sixth shot region S6 is arranged at the exposure end position. FIG. 8B shows a state immediately prior to the first pattern formation region SA1, the second pattern formation region SA2, and the sixth shot region S6 respectively moving to the exposure end position.

In the above, an example of the procedure for multiply exposing the fifth and sixth shot regions S5, S6 was described. A plurality of shot regions S are provided on the substrate P, and the control apparatus 8 sequentially multiply exposes the respective shot regions S based on the procedure described above.

In the above way, in the present embodiment, it is possible to multiply expose (dual exposure) one shot region S on the substrate P with the image of the first pattern PA1 and with the image of the second pattern PA2 using one scan operation.

In the above, an example of the procedure for multiply exposing the fifth and sixth shot regions S5, S6 was described. The control apparatus 8 reverses the movement direction of the substrate P each time the respective shot regions are to be exposed using the first exposure light EL1 and the second exposure light EL2 and exposes the respective shot regions. In the second exposure mode, projection of the first and second patterns PA1, PA2 is performed respectively by the first and second masks' M1, M2 movement in one direction and movement in the reverse direction.

As described above, in the first exposure mode of the present embodiment, it is possible to, for example, shorten the time until the second pattern PA2 starts movement for scanning exposure after the first pattern PA1 has ended movement for scanning exposure, and when considered in terms of the time required until all of the shot regions on the substrate have finished being exposed, the time can be markedly shortened in comparison with the exposure method in which the movement direction of the substrate is reversed each time one shot exposure is performed. In the present embodiment, for example, the second pattern PA2 performs preparation processing for the next exposure operation while the first pattern PA1 is engaged in the exposure operation (during movement for scanning exposure). For example, the exposure operation using the first pattern ends, and it is possible to complete the preparatory operation of the second pattern PA2 (the operation of arranging the second pattern PA2 at the exposure start position) prior to that first pattern PA1 being arranged at the exposure end position. For this reason, it is possible to immediately start the exposure operation that uses the second pattern after the exposure operation that uses the first pattern PA1 has ended. Therefore, it is possible to restrict reductions in throughput. Moreover, in this example, the preparatory operation for the next exposure operation that uses the second pattern PA2 is an operation that causes the second pattern PA2 to stand by at its current position after the exposure operation has been performed the previous time using the second pattern PA2. Specifically, after the exposure operation has been performed the previous time using the second pattern PA2 as described in Japanese Laid-Open Patent Publication 9-007933 discussed above, there is no need for a time-consuming operation in which the second pattern PA2 is decelerated→stopped→and reversed, and movement in the reverse direction is started→decelerated→stopped→and reversed, then accelerated toward the illumination region IR2 for the next exposure operation that uses the second pattern PA2.

In the present embodiment, an example of the case in which the projection optical system PL forms an inverted image and synchronously moves the substrate P in one direction (for example, the +Y direction) while moving the first pattern PA1 and the second pattern PA2 in a direction that is the reverse of (−Y direction) the movement direction of the substrate P when the shot region S on the substrate is to be exposed was described. In the case in which the projection optical system PL forms an erect image, by synchronously moving the substrate P in one direction (for example, the +Y direction) while moving the first pattern PA1 and the second pattern PA2 in the same direction (+Y direction) as the movement direction of the substrate P, it is possible to project images of the first and second patterns PA1, PA2 to the shot region S on the substrate P. In this way, the movement direction of the first and second patterns PA1, PA2 and the movement direction of the substrate P when the shot region S is to be exposed may be the same or may be different.

In addition, in the present embodiment, an example of the case in which the first optical system PL1 forms an inverted image of the first pattern PA1, and the second optical system PL2 forms an inverted image of the second pattern PA2 was described. In that case, for example, in the first exposure mode, after the first pattern PA1 has moved in one direction (for example, the +Y direction), the second pattern PA2 also moves in the same direction (+Y direction) as the first pattern PA1. In addition, in the second exposure mode, the shot region S is multiply exposed while the first pattern PA1 and the second pattern PA2 are moving in the same direction. On the other hand, for example, in the case in which the first optical system PL1 forms an erect image, and the second optical system PL2 forms an inverted image, in the first exposure mode, after the first pattern PA1 has moved in one direction (for example, +Y direction), the second pattern PA2 moves in the direction that is the reverse of (−Y direction) that of the first pattern PA1. In addition, in the second exposure mode, the shot region is multiply exposed while the first pattern PA1 and the second pattern PA2 are moving in opposite directions.

In the present embodiment, the first exposure region PR1 and the second exposure region PR2 nearly completely overlap (match), but only a part of the first exposure region PR1 and the second exposure region PR2 may also overlap. In addition, the first exposure region PR1 and the second exposure region PR2 may also be separated in relation to the scanning direction (Y axis directions). In that case, the distance between the first exposure region PR1 (the center of the first exposure region PR1) and the second exposure region PR2 (the center of the second exposure region PR2) in the Y axis direction may also be made smaller than the width of one shot region S on the substrate P in the Y axis direction so that the first exposure region PR1 and the second exposure region PR2 can be arranged simultaneously at one shot region S.

Second Embodiment

Next, a second embodiment will be described. In the following description, identical symbols are assigned to constituent portions that are identical or equivalent to those of the embodiment discussed above, and explanations thereof will be abbreviated or omitted.

Figure 9:
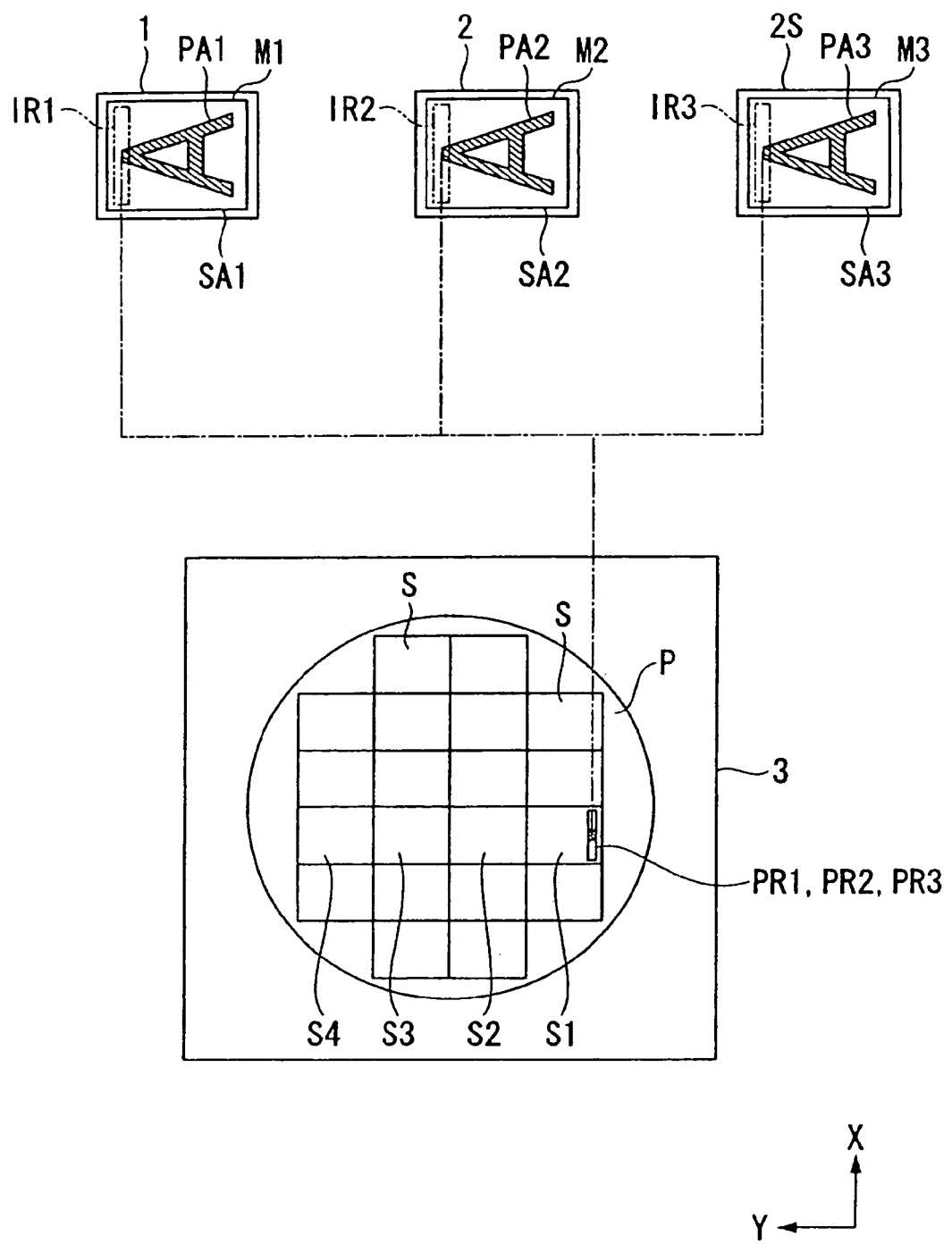
FIG. 9 is a view that shows an example relating to an exposure apparatus according to the second embodiment.

FIG. 9 is a schematic view that shows an example of the exposure apparatus EX according to the second embodiment. As shown in FIG. 9, the exposure apparatus EX comprises a first mask stage 1 that moves the first mask M1, on which a first pattern PA1 has been formed, in a prescribed scanning direction, a second mask stage 2 that moves the second mask M2, on which a second pattern PA2 has been formed, in a prescribed scanning direction, and a third mask stage 2S that moves a third mask M3, on which a third pattern PA3 has been formed, in a prescribed scanning direction. In the present embodiment, the scanning directions of the first, second and third patterns PA1, PA2, PA3 are all the Y axis directions. In the present embodiment, the first pattern PA1, the second pattern PA2 and the third pattern PA3 are all the same pattern. However, it is also possible for at least one of the first pattern PA1, the second pattern PA2 and the third pattern PA3 to be a different pattern, and all three may also be different patterns. In addition, though not shown in the drawing, the exposure apparatus EX comprises a first illumination system that illuminates the first pattern PA1 using a first exposure light EL1, a second illumination system that illuminates the second pattern PA2 using a second exposure light EL2, and a third illumination system that illuminates the third pattern PA3 using a third exposure light EL3. The first illumination system illuminates a first illumination region IR1 using the first exposure light EL1, the second illumination system illuminates a second illumination region IR2 using the second exposure light EL2, and the third illumination system illuminates a third illumination region IR3 using the third exposure light EL3. The first, second and third illumination regions IR1, IR2, IR3 are respectively long, rectangular shapes extending in the X axis direction.

In addition, as shown in FIG. 9, the exposure apparatus EX comprises a substrate stage 3 that holds the substrate P and is able to move. The substrate stage 3 is able to move a plurality of shot regions S on the substrate P in a prescribed scanning direction relative to a first exposure region PR1 to which the first exposure light EL1 is irradiated from the first pattern PA1, a second exposure region PR2 to which the second exposure light EL2 is irradiated from the second pattern PA2, and a third exposure region PR3 to which the third exposure light EL3 is irradiated from the third pattern PA3. In the present embodiment, the scanning direction of the shot region S is the Y axis directions. In addition, the first second and third exposure regions PR1, PR2, PR3 are respectively long, rectangular shapes extending in the X axis direction and overlap on the substrate P.

The control apparatus 8, when the substrate P is moving in one direction (for example, the +Y direction), performs a preparatory operation for moving the first pattern PA1 in a prescribed direction to expose the first shot region S1 on the substrate P using the first exposure light EL1 irradiated to the first exposure region PR1 while moving the second pattern PA2 in a prescribed direction to expose the second shot region S2 on the substrate P using the second exposure light EL2 irradiated to the second exposure region PR2. In addition, the first mask stage 1, the second mask stage 2, the third mask stage 2S and the substrate stage 3 are controlled so that, after exposure of the first shot region S1 has been completed, a preparatory operation is performed for, while the substrate P has been moved continuously in one direction (for example, the +Y direction), synchronizing with this to move the second pattern PA2 in the prescribed direction and expose the second shot region S2 on the substrate P using the second exposure light EL2 irradiated to the second exposure region PR2, while moving the third pattern PA3 in the prescribed direction to expose the third shot region S3 on the substrate P using the third exposure light EL3 irradiated to the third exposure region PR3 while a preparatory operation is performed for moving the first pattern PA1 in a direction that is the reverse of the prescribed direction and then moving the first pattern PA1 in the prescribed direction to expose the fourth shot region S4 on the substrate P using the first exposure light EL1 irradiated to the first exposure region PR1. As shown in FIG. 9, in the present embodiment, the first shot region S1, the second shot region S2, the third shot region S3 and the fourth shot region S4 are adjacent in relation to the Y axis direction on the substrate P.

Figure 10A:
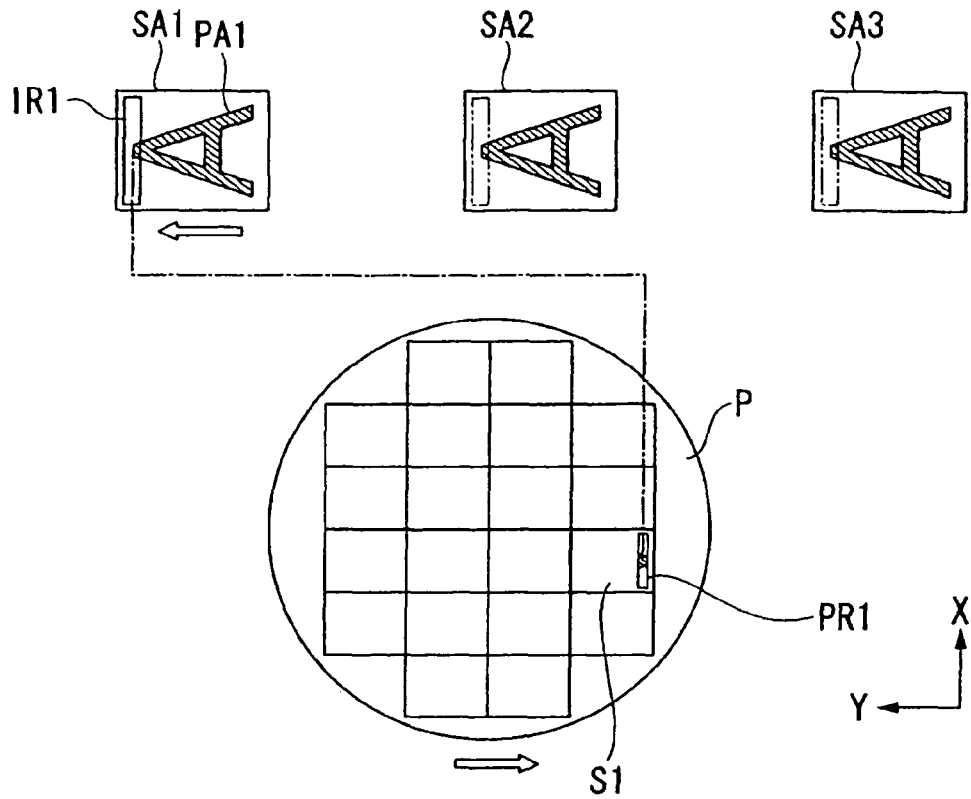
FIGS. 10A and 10B are views describing an example of the operations of an exposure apparatus according to the second embodiment.
Figure 10B:
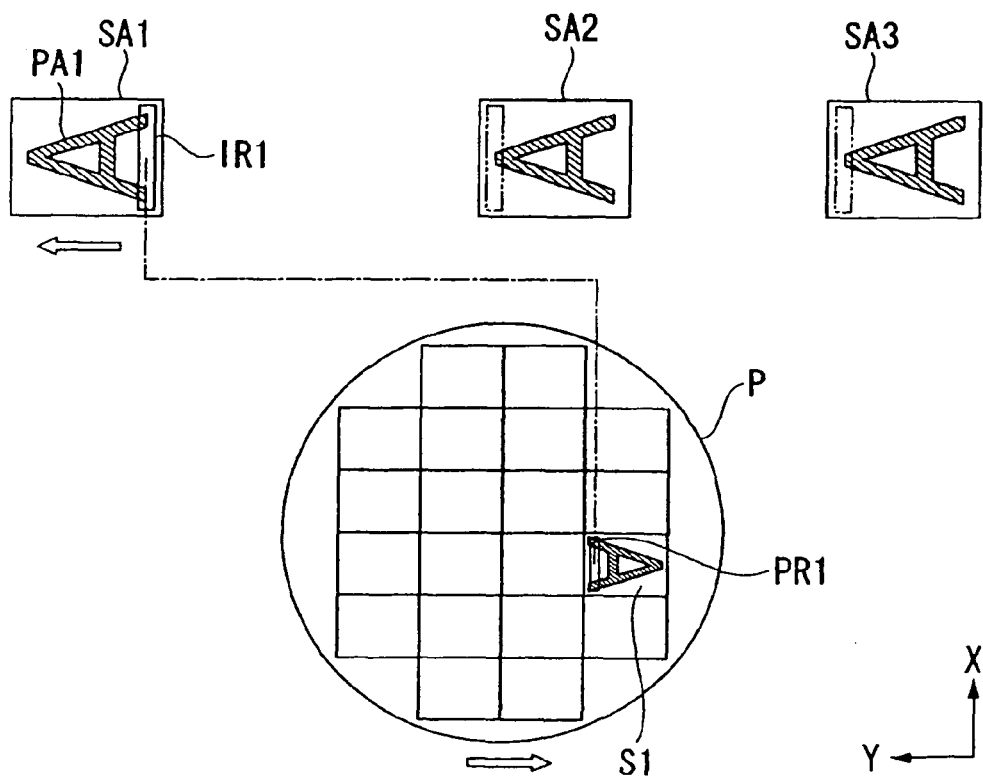

Hereunder, an example of a procedure in which the first-fourth shot regions S1-S4 are exposed will be described while referring to the schematic views of FIGS. 10A-13B. FIGS. 10A-B are views for describing the operation of exposing the first shot region S1. First, the control apparatus 8 uses the first mask stage 1 to execute a preparatory operation of the first pattern PA1 for exposing the first shot region S1 using the first exposure light EL1 from the first pattern PA1.

In the present embodiment, the initial preparatory operation of the first pattern PA1 includes a movement operation of the first pattern PA (first mask stage 1) for arranging the first pattern PA1 at the exposure start position (scanning start position), and the control apparatus 8 moves the first mask stage 1, which holds the first mask M1, for arranging the first pattern PA1 at the exposure start position. The control apparatus 8 moves the first pattern PA1 to the exposure start position.

The control apparatus 8 respectively moves the first pattern PA1 and the first shot region S1 to the exposure start position in order to expose the first shot region S1 using the first exposure light EL1 from the first pattern PA1.

After the first pattern PA1 and the first shot region S1 are respectively moved to the exposure start position, the control apparatus 8 controls the first mask stage 1 and the substrate stage 3 to perform movement of the first pattern PA1 in the +Y direction and movement of the first shot region S1 in the −Y direction. FIG. 10A shows a state immediately after the first pattern formation region SA1 and the first shot region S1 have moved from the exposure start position.

Then, the control apparatus 8 uses the first mask stage 1 to move the first pattern PA1 in the +Y direction at a prescribed scanning velocity relative to the first illumination region IR1 for the purpose of scanning exposure of the first shot region S1. The control apparatus 8 moves the first pattern PA1 up to the exposure end position when the first shot region S1 is being exposed. In addition, the control apparatus 8 synchronizes with the movement of the first pattern PA1 in the +Y direction to continue movement of the first shot region S1 in the −Y direction. The control apparatus 8 moves the first shot region S1 up to the exposure end position. Through this operation, projection of an image of the first pattern PA1 resulting from the first exposure light EL1 to the first shot region S1 ends. FIG. 10B shows a state immediately prior to the first pattern formation region SA1 and the first shot region S1 being moved to the exposure end position.

The control apparatus 8 starts exposure of the second shot region S2 after exposure of the first shot region S1 is ended. Here, in the present embodiment, the control apparatus 8 uses the second mask stage 2 to complete the preparatory operation of the second pattern PA2 for exposing the second shot region S2 using the second exposure light EL2 from the second pattern PA2 prior to exposure of the first shot region S1 ending. In the present embodiment, a preparatory operation is executed for exposing the second shot region S2 using the second exposure light EL2 from the second pattern PA2 during exposure of the first shot region S1 using the first exposure light EL1 from the first pattern PA1 irradiated to the first exposure region PR1.

In the present embodiment, the preparatory operation for exposing the second shot region S2 includes a movement operation for the second pattern PA2 (second mask stage 2) for arranging the second pattern PA2 at the exposure start position, and the control apparatus 8 moves the second mask stage 2, which holds the second mask M2, in order to arrange the second pattern PA2 at the exposure start position.

The control apparatus 8 respectively moves the second pattern PA2 and the second shot region S2 to the exposure start position in order to expose the second shot region S2 using the second exposure light EL2 from the second pattern PA2.

Figure 11A:
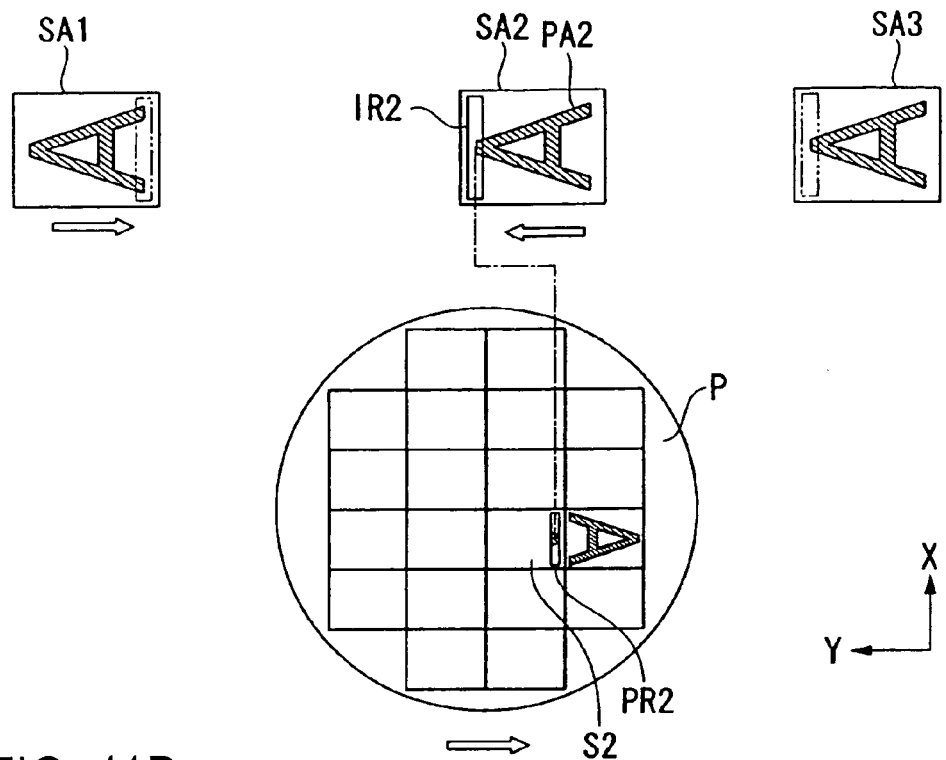
FIGS. 11A and 11B are views describing an example of the operations of an exposure apparatus according to the second embodiment.

After the second pattern PA2 and the second shot region S2 have respectively moved to the exposure start position, the control apparatus 8 controls the second mask stage 2 and the substrate stage 3 to start movement of the second pattern PA2 in the +Y direction and movement of the second shot region S2 in the −Y direction. FIG. 11A shows the state immediately after the second pattern formation region SA2 and the second shot region S2 have moved from the exposure start position.

Figure 11B:
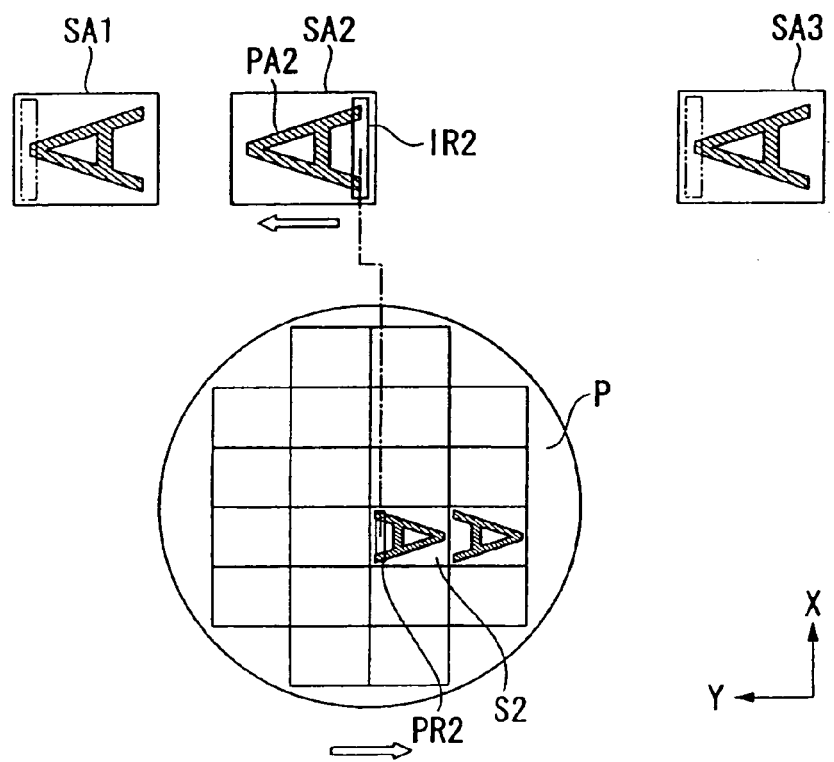

Then, the control apparatus 8 uses the second mask stage 2 to move the second pattern PA2 in the +Y direction at a prescribed scanning velocity relative to the second illumination region IR2 for the purpose of scanning exposure of the second shot region S2. The control apparatus 8 moves the second pattern PA2 up to the exposure end position when the exposure of the second shot region S2 is being performed. In addition, the control apparatus 8 synchronizes with the movement of the second pattern PA2 in the +Y direction to continue movement of the second shot region S2 in the −Y direction. The control apparatus 8 moves the second shot region S2 up to the exposure end position. Through this operation, projection of an image of the second pattern PA resulting from the second exposure light EL2 to the second shot region S2 ends. FIG. 11B shows the state immediately prior to the second pattern formation region SA2 and the second shot region S2 moving to the exposure end position.

In addition, in the present embodiment, a preparatory operation is executed for exposing a third shot region S3 using the third exposure light EL3 from the third pattern PA3 during exposure of the second shot region S2 using the second exposure light EL2 from the second pattern PA2 irradiated to the second exposure region PR2. The preparatory operation for exposing the third shot region S3 includes a movement operation of the third pattern PA3 (third mask stage 2S) for arranging the third pattern PA3 at the exposure start position, and the control apparatus 8 moves the third mask stage 2S, which holds the third mask M3, in order to arrange the third pattern PA3 at the exposure start position.

In addition, as shown in FIGS. 11A-11B, the control apparatus 8 controls the first mask stage 1 to move the first pattern PA1 in a direction that is the reverse of (−Y direction) the movement direction (+Y direction) when the first shot region S1 is exposed in parallel with at least a part of the operation of moving the substrate P in the −Y direction while the second shot region S2 is exposed using the second exposure light EL2 from the second pattern PA2.

The control apparatus 8 starts exposure of the third shot region S3 after exposure of the second shot region S2 has ended. In the present embodiment, the preparatory operation of the third pattern PA3 for exposing the third shot region S3 using the third exposure light EL3 from the third pattern PA3 has already ended prior to exposure of the second shot region S2 ending, and the third pattern PA3 is arranged at the exposure start position.

The control apparatus 8 respectively moves the third pattern PA3 and the third shot region S3 to the exposure start position for exposing the third shot region S3 using the third exposure light EL3 from the third pattern PA3.

Figure 12A:
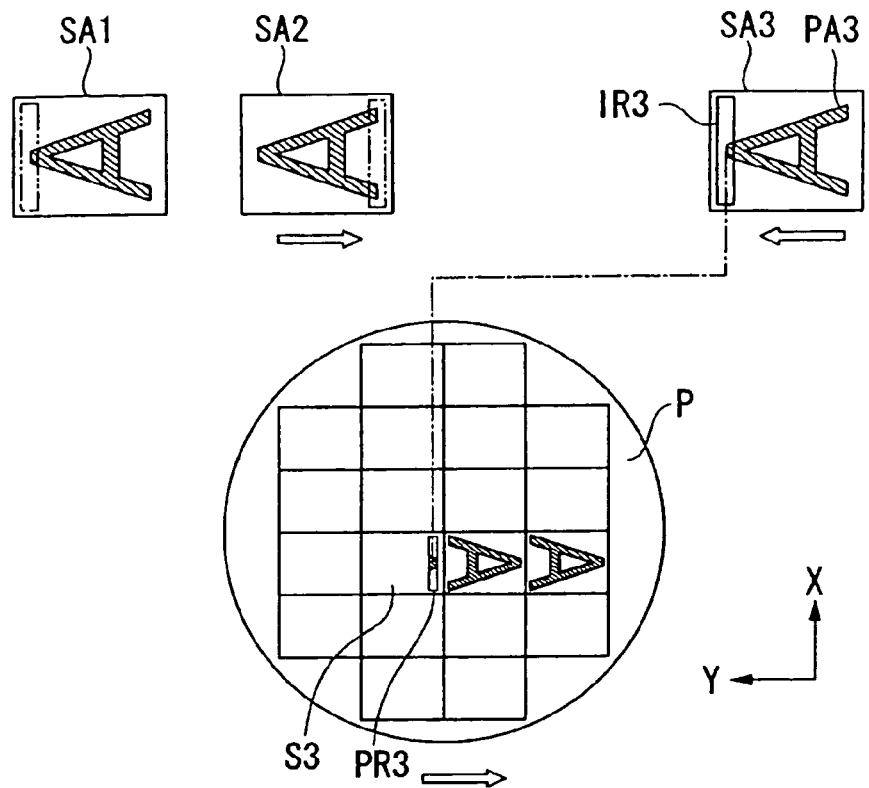
FIGS. 12A and 12B are views describing an example of the operations of an exposure apparatus according to the second embodiment.

After the third pattern PA3 and the third shot region S3 have respectively been moved to the exposure start position, the control apparatus 8 controls the third mask stage 2S and the substrate stage 3 to start movement of the third pattern PA3 in the +Y direction and movement of the third shot region S3 in the −Y direction. FIG. 12A shows a state immediately after the third pattern formation region SA3 and the third shot region S3 have moved from the exposure start position.

Figure 12B:
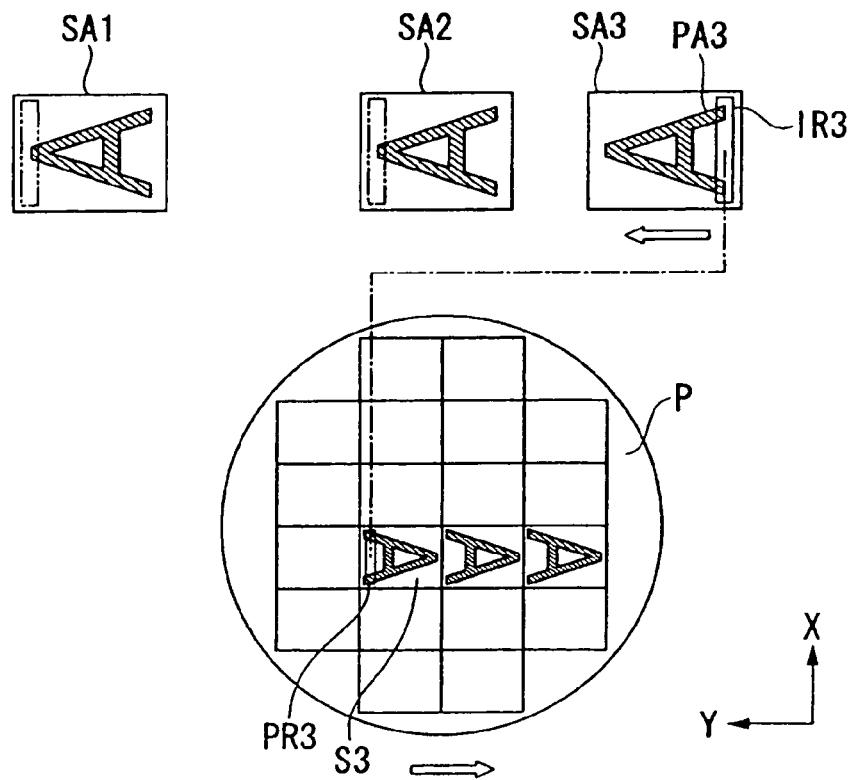

Then, the control apparatus 8 uses the third mask stage 2S to move the third pattern PA3 in the +Y direction at a prescribed scanning velocity relative to the third illumination region IR3 for the purpose of scanning exposure of the third shot region S3. The control apparatus 8 moves the third pattern PA3 up to the exposure end position when the third shot region S3 is being exposed. In addition, the control apparatus 8 synchronizes with the movement of the third pattern PA3 in the +Y direction to continue movement of the third shot region S3 in the −Y direction. The control apparatus 8 moves the third shot region S3 up to the exposure end position. Through this operation, projection of an image of the third pattern PA3 resulting from the third exposure light EL3 to the third shot region S3 ends. FIG. 12B shows a state immediately prior to the third pattern formation region SA3 and the third shot region S3 moving to the exposure end position.

In addition, as shown in FIGS. 12A-12B, the control apparatus 8 controls the second mask stage 2 to move the second pattern PA2 in a direction that is the reverse of (−Y direction) the movement direction (+Y direction) when the second shot region S2 is to be exposed in parallel with at least a part of the operation of moving the substrate P in the −Y direction while exposing the third shot region S3 using the third exposure light EL3 from the third pattern PA3.

In addition, in the present embodiment, a preparatory operation is completed for exposing the fourth shot region S4 using the first exposure light EL1 from the first pattern PA1 while the third shot region S3 is exposed using the third exposure light EL3 from the third pattern PA3 irradiated to the third exposure region PR3. The preparatory operation for exposing the fourth shot region S4 includes a movement operation of the first pattern PA1 (first mask stage 1) for arranging the first pattern PA1 at the exposure start position, and the control apparatus 8 moves the first mask stage 1, which holds the first mask M1, in order to arrange the first pattern PA1 at the exposure start position.

The control apparatus 8 starts exposure of the fourth shot region S4 after exposure of the third shot region S3 is ended. In the present embodiment, the preparatory operation of the first pattern PA1 for exposing the fourth shot region S4 using the first exposure light EL1 from the first pattern PA1 has already ended prior to exposure of the third shot region S3 ending, and the first pattern PA1 is arranged at the exposure start position.

The control apparatus 8 respectively moves the first pattern PA1 and the fourth shot region S4 to the exposure start position in order to expose the fourth shot region S4 using the first exposure light EL1 from the first pattern PA1.

Figure 13A:
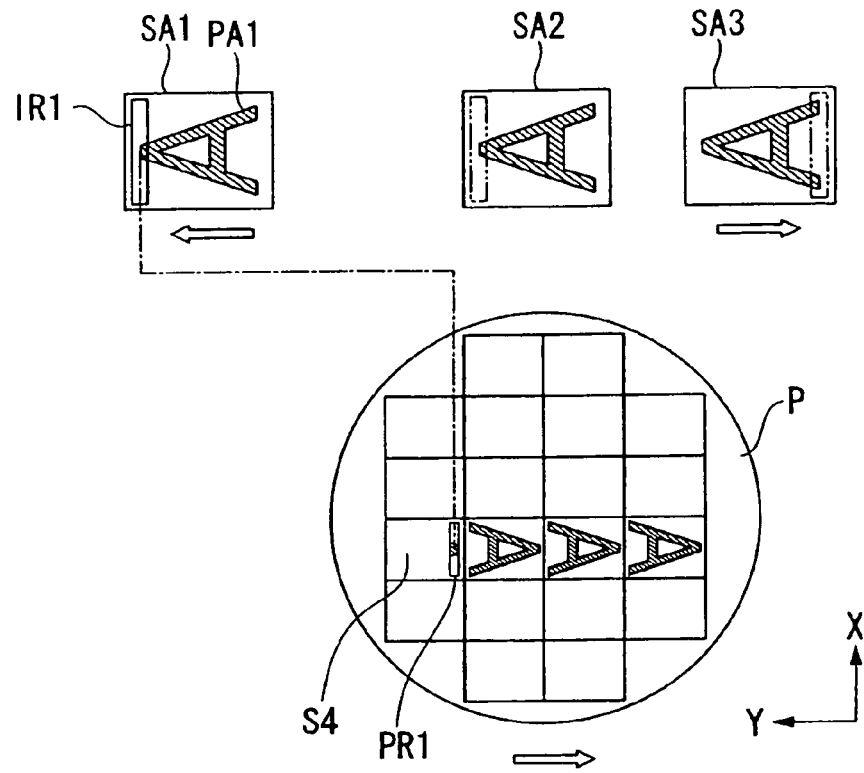
FIGS. 13A and 13B are views describing an example of the operations of an exposure apparatus according to the second embodiment.

After the first pattern PA1 and the fourth shot region S4 are respectively moved to the exposure start position, the control apparatus 8 controls the first mask stage 1 and the substrate stage 3 to start movement of the first pattern PA1 in the +Y direction and movement of the fourth shot region S4 in the −Y direction. FIG. 13A shows a state immediately after the first pattern formation region SA1 and the fourth shot region S4 have moved from the exposure start position.

Figure 13B:
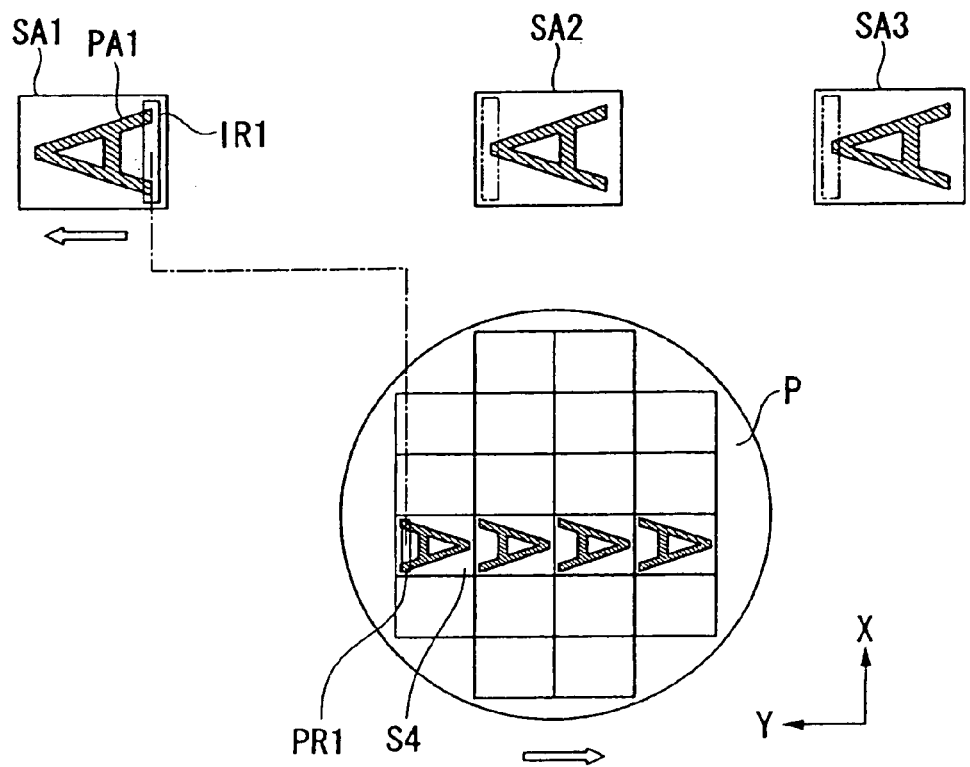

Then, the control apparatus 8 uses the first mask stage 1 to move the first pattern PA1 at a prescribed scanning velocity relative to the first illumination region IR1 for the purpose of scanning exposure of the fourth shot region S4. The control apparatus 8 moves the first pattern PA1 up to the exposure end position when exposure of the fourth shot region S4 is being performed. In addition, the control apparatus 8 synchronizes with the movement of the first pattern PA1 in the +Y direction to continue movement of the fourth shot region S4 in the −Y direction. The control apparatus 8 moves the fourth shot region S4 up to the exposure end position. Through this operation, projection of an image of the first pattern PA1 resulting from the first exposure light EL1 to the fourth shot region S4 ends. FIG. 13B shows a state immediately prior to the first pattern formation region SA1 and the fourth shot region S4 respectively moving to the exposure end position.

In addition, as shown in FIGS. 13A-13B, the control apparatus 8 controls the third mask stage 2S to move the third pattern PA3 in a direction that is the reverse of (−Y direction) the movement direction (+Y direction) when the third shot region S3 is exposed in parallel with at least a part of the operation of moving the substrate P in the −Y direction while exposing the fourth shot region S4 using the first exposure light EL from the first pattern PA1.

Similar processing is repeated below. In the present embodiment as well, a reduction in throughput can be restricted.

Through the second embodiment above, three mask stages are provided, so the preparatory operation in which, after one mask stage has completed scanning, deceleration→stoppage→reversal are performed, then movement→stoppage→acceleration to the next exposure are performed should be completed during the time until exposure of 2 shots on the substrate is completed. For this reason, moving the substrate in one direction while consecutively exposing the shot regions on the substrate arrayed in this one direction, which has been a problem in practical terms with a configuration in which there only two mask stages, such as that disclosed in Japanese Laid-Open Publication No. 9-007933 discussed above, will realistically become possible. Of course, the number of mask stages in this embodiment is not limited to three, and it may also be four or more.

In the respective embodiments discussed above, a light transmitting type mask that forms a prescribed shielding pattern (or phase pattern/dimming pattern) on a light transmissive substrate is used, but instead of this mask, a variable forming mask (also called electronic mask, active mask, or image generator) that forms a transmittance pattern, a reflection pattern or a light emitting pattern based on electronic data of the pattern to be exposed, such as that disclosed in U.S. Pat. No. 6,778,257, may also be used. The variable forming mask includes, for example, a DMD (digital micro-mirror device), which is a kind of non-emissive type image display device (spatial light modulator). In addition, the variable forming mask is not limited to a DMD, and the non-emissive type image display device described below may be used in place of a DMD. Here, the non-emissive type image display device is an element that spatially modulates the amplitude (intensity), phase or deflection state of light that progresses in a prescribed direction, and examples of non-emissive type image display devices are, in addition to a transmission type liquid crystal display element (LCD: liquid crystal display), an electro-chromic display (ECD), etc. In addition, other examples of a reflecting type spatial light modulator are, in addition to the DMD discussed above, a reflection mirror array, a reflecting type liquid crystal display element, an electrophoretic display (EPD), electronic paper (or electronic ink), and a grating light valve.

In addition, instead of the variable forming mask comprising a non-emissive type image display device, a pattern forming apparatus that includes a self-emissive type image display element may be used. In this case, an illumination system is not required. Here, examples of the self-emissive type image display element are a CRT (cathode ray tube), an inorganic EL display, an organic EL display (OLED: organic light emitting diode), an LED display, an LD display, a field emission display (FED), and a plasma display (PDP: plasma display panel). In addition, used for the self-emissive type image display element with which the pattern formation apparatus is equipped are a solid state light source chip that has a plurality of light emission points, a solid state light source chip array on which chips are arranged in a plurally arrayed shape, or a type in which a plurality of light emission points are built into one substrate, and the solid state light source chip may also be electrically controlled to form a pattern. Note that the solid state light source element may be inorganic or organic.

Note that, applicable as the substrate P of the aforementioned respective embodiments are not only a semiconductor wafer for the manufacture of semiconductor devices but glass substrates for display devices, ceramic wafers for thin film magnetic heads, or mask or reticle base plates, etc. (synthetic quartz, silicon wafer) used in exposure apparatuses.

In addition, the present invention is also applicable to twin stage type exposure apparatus that comprise a plurality of substrate stages such as those disclosed in U.S. Pat. Nos. 6,341,007, 6,400,441, 6,549,269, 6,590,634, 6,208,407, and 6,262,796.

Moreover, the present invention can also be applied to an exposure apparatus comprising a measuring stage equipped with a substrate stage that holds a substrate, a fiducial member on which a fiducial mark is formed and/or a measuring stage that comprises various photoelectric sensors such as those disclosed in, for example, U.S. Pat. No. 6,897,963. The types of exposure apparatus EX are not limited to exposure apparatus for semiconductor device fabrication that expose a semiconductor device pattern on a substrate P but are also widely applicable to exposure apparatus for the manufacture of liquid crystal display elements and for the manufacture of displays, and exposure apparatus for the manufacture of thin film magnetic heads, image pickup elements (CCDs), micromachines, MEMS, DNA chips or reticles or masks.

Note that, in the respective embodiments discussed above, an interferometer system that includes a laser interferometer was used to measure the respective position information of the mask stage and the substrate stage, but it is not limited to this, and it is also possible to use, for example, an encoder system that detects the scale (diffraction grating) provided in the respective stages.

In addition, in the respective embodiments discussed above, for the light source apparatus that generates ArF excimer laser light as the exposure light EL, it is possible to use an ARF excimer laser, but is also possible to use a high frequency wave generating apparatus that includes a solid state laser light source such as a DFB semiconductor laser or a fiber laser, a light amplification part that has a fiber amp, a wavelength conversion part, etc. and outputs pulsed light with a wavelength of 193 nm such as that disclosed in U.S. Pat. No. 7,023,610. In addition, in the embodiments discussed above, the respective illumination regions and projection regions (exposure regions) discussed above were respectively rectangular in shape, but it is also possible to use other shapes, for example, arc shapes.

In the respective embodiments discussed above, an exposure apparatus that comprises a projection optical system was described as an example, but it is also possible to apply the present invention to an exposure apparatus and exposure method that does not use a projection optical system. Even in the case in which a projection optical system is not used in this way, the exposure light can be irradiated to the substrate via an optical member such as a lens. In addition, a liquid immersion space is formed in a prescribed space between that optical member and the substrate.

In the above way, the exposure apparatus EX of the embodiment of the present application is manufactured by assembling various subsystems, including the respective constituent elements, so that the prescribed mechanical precision, electrical precision and optical precision can be maintained. To ensure these respective precisions, performed before and after this assembly are adjustments for achieving optical precision with respect to the various optical systems, adjustments for achieving mechanical precision with respect to the various mechanical systems, and adjustments for achieving electrical precision with respect to the various electrical systems. The process of assembly from the various subsystems to the exposure apparatus includes mechanical connections, electrical circuit wiring connections, air pressure circuit piping connections, etc. among the various subsystems. Obviously, before the process of assembly from these various subsystems to the exposure apparatus, there are the processes of individual assembly of the respective subsystems. When the process of assembly of the various subsystems to the exposure apparatus has ended, overall adjustment is performed, and the various precisions are ensured for the exposure apparatus as a whole. Note that it is preferable that manufacture of the exposure apparatus be performed in a clean room in which the temperature, the degree of cleanliness, etc. are controlled.

Figure 14:
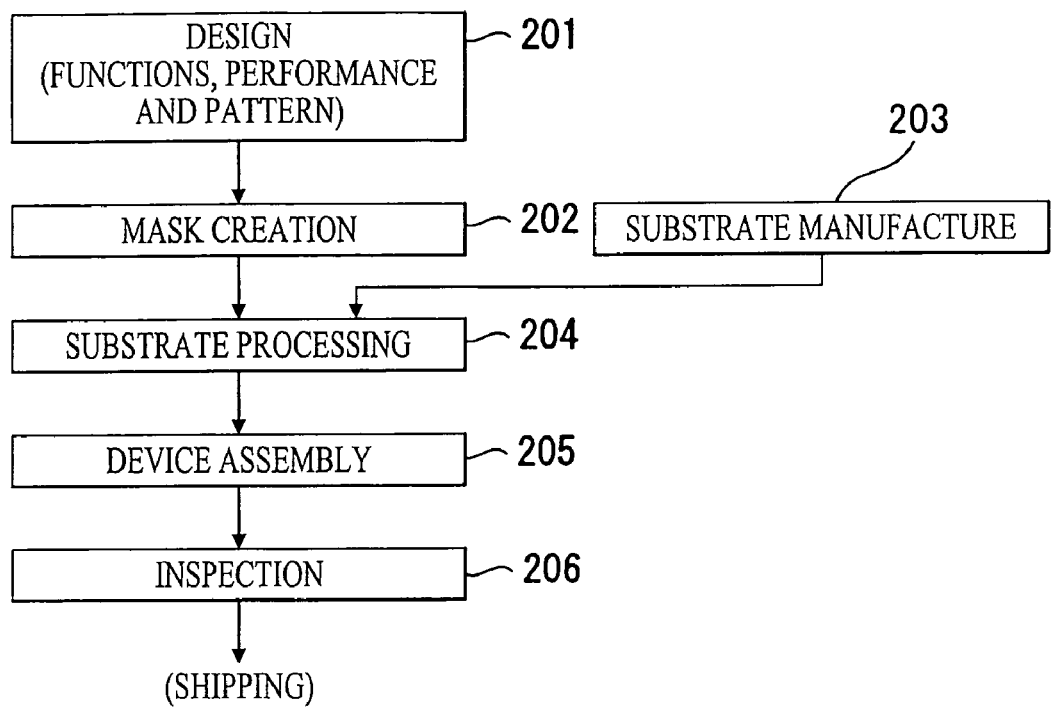
FIG. 14 is a flowchart that shows an example of the manufacturing process of a microdevice.

As shown in FIG. 14, microdevices such as semiconductor devices are manufactured by going through a step 201 that performs microdevice function and performance design, a step 202 that creates the mask (reticle) based on this design step, a step 203 that manufactures the substrate that is the device base material, a substrate processing step 204 that includes substrate processing (exposure processing) that exposes the substrate using exposure light using the pattern of the mask according to the embodiments discussed above and develops the exposed substrate, a device assembly step (including processing processes such as the dicing process, bonding process and packaging process) 205, an inspection step 206, etc.

The features of the respective embodiments discussed above may be combined. In addition, insofar as it is permitted by law, the disclosures of all U.S. patents and patent publications relating to the exposure apparatus, etc. that have been cited in the respective embodiments and modification examples discussed above are incorporated herein by reference in their entireties.

What is claimed is:

1. An exposure apparatus that exposes a substrate, the exposure apparatus comprising:
a first moving apparatus that moves a first pattern in a prescribed scanning direction;
a second moving apparatus that moves a second pattern in the prescribed scanning direction;
a substrate moving apparatus that moves a substrate having a plurality of shot regions in the prescribed scanning direction to a first exposure region to which a first exposure light from the first pattern is irradiated and to a second exposure region to which a second exposure light from the second pattern is irradiated; and
a controller that controls the first moving apparatus, the second moving apparatus and the substrate moving apparatus using a first exposure mode that: (1) when the substrate is moving in one direction, moves the first pattern in a prescribed direction to expose a first shot region on the substrate using the first exposure light irradiated to the first exposure region, (2) then continues movement of the substrate in the one direction while moving the second pattern in a specified direction to expose a second shot region on the substrate, (3) then reverses the respective movement directions of the substrate and the second pattern so as to be reverse directions to expose a third shot region on the substrate using the second exposure light irradiated to the second exposure region, and (4) then continues movement of the substrate in the reverse direction while moving the first pattern in a direction that is the reverse of the prescribed direction to expose a fourth shot region on the substrate using the first exposure light irradiated to the first exposure region.

2. The exposure apparatus according to claim 1, wherein, in the first exposure mode, during an exposure operation in which one of the first and second patterns is used, a preparatory operation for a next exposure operation is performed for the other of the first and second patterns.

3. The exposure apparatus according to claim 2, wherein the preparatory operation includes at least one of an acceleration operation, a deceleration operation and a stopping operation.

4. The exposure apparatus according to claim 1, further comprising:
a first illumination system that illuminates the first pattern using the first exposure light; and
a second illumination system that illuminates the second pattern using the second exposure light,
wherein the first illumination system illuminates the first pattern during movement of the first pattern, and the second illumination system illuminates the second pattern during movement of the second pattern.

5. The exposure apparatus according to claim 1, wherein:
the controller controls the first moving apparatus, the second moving apparatus and the substrate moving apparatus using a second exposure mode that: (i) when the substrate is moving in the one direction, moves the first pattern and the second pattern respectively in the prescribed direction to simultaneously expose one of the shot regions on the substrate using the first exposure light irradiated to the first exposure region and the second exposure light irradiated to the second exposure region, and (ii) then reverses the respective movement directions of the substrate, the first pattern and the second pattern so as to be reverse directions to, when the substrate is moving in the reverse direction, simultaneously expose another one of the shot regions on the substrate using the first exposure light irradiated to the first exposure region and the second exposure light irradiated to the second exposure region.

6. The exposure apparatus according to claim 5, wherein:
in the first exposure mode, the first pattern and the second pattern are identical patterns; and
in the second exposure mode, the first pattern and the second pattern are different patterns.

7. The exposure apparatus according to claim 5, further comprising:
a first illumination system that illuminates the first pattern using the first exposure light; and
a second illumination system that illuminates the second pattern using the second exposure light, wherein:
in the first exposure mode, during illumination with respect to one of the first and second patterns, the other of the first and second patterns is not illuminated, and
in the second exposure mode, an illumination operation with respect to the second pattern is executed in parallel with at least a part of the illumination operation with respect to the first pattern.

8. The exposure apparatus according to claim 1, wherein at least a part of the first exposure region and the second exposure region overlap.

9. The exposure apparatus according to claim 1, further comprising:
a first optical system that forms an image of the first pattern in the first exposure region; and
a second optical system that forms an image of the second pattern in the second exposure region.

10. The exposure apparatus according to claim 9, wherein, in the first exposure mode, the image of the first pattern and the image of the second pattern are not superposed.

11. The exposure apparatus according to claim 9, wherein the first optical system and the second optical system share at least some optical elements.

12. The exposure apparatus according to claim 11, wherein the shared optical elements include a final optical element that emits the first and second exposure lights to the first and second exposure regions.

13. The exposure apparatus according to claim 1, wherein:
the first moving apparatus includes a first mask stage that holds a first mask member, on which the first pattern is formed; and
the second moving apparatus includes a second mask stage that holds a second mask member, on which the second pattern is formed.

14. A device manufacturing method comprising:
exposing a substrate using an exposure apparatus according to claim 1; and
developing the exposed substrate.

15. An exposure apparatus that exposes a substrate, the exposure apparatus comprising:
a first moving apparatus that moves a first pattern in a prescribed scanning direction;
a second moving apparatus that moves a second pattern in the prescribed scanning direction;
a third moving apparatus that moves a third pattern in the prescribed scanning direction;
a substrate moving apparatus that moves a substrate having a plurality of shot regions in the prescribed scanning direction to a first exposure region to which a first exposure light from the first pattern is irradiated, to a second exposure region to which a second exposure light from the second pattern is irradiated, and to a third exposure region to which a third exposure light from the third pattern is irradiated; and a controller that controls the first moving apparatus, the second moving apparatus, the third moving apparatus and the substrate moving apparatus so that when the substrate is moving in one direction: (1) a first preparatory operation is performed for moving the second pattern in a prescribed direction to expose a second shot region on the substrate using the second exposure light irradiated to the second exposure region while moving the first pattern in the prescribed direction to expose a first shot region on the substrate using the first exposure light irradiated to the first exposure region, (2) after completion of an exposure of the first shot region using the first exposure light irradiated to the first exposure region, and while moving the second pattern in the prescribed direction to expose the second shot region on the substrate using the second exposure light irradiated to the second exposure region, a second preparatory operation is performed for moving the third pattern in the prescribed direction to expose a third shot region on the substrate using the third exposure light irradiated to the third exposure region and for moving the first pattern in a direction that is the reverse of the prescribed direction to expose a fourth shot region on the substrate using the first exposure light irradiated to the first exposure region and then (3) after exposing the third shot region by moving the third pattern in the prescribed direction using the third exposure light irradiated to the third exposure region, moving the first pattern in the prescribed direction to expose the fourth shot region on the substrate using the first exposure light irradiated to the first exposure region.

16. The exposure apparatus according to claim 15, wherein each of the first and second preparatory operations includes at least one of an acceleration operation, a deceleration operation and a stopping operation.

17. A device manufacturing method comprising:
exposing a substrate using an exposure apparatus according to claim 15; and
developing the exposed substrate.

18. An exposure method that exposes a substrate, the method comprising:
synchronously with movement of the substrate in one direction, moving a first pattern in a prescribed direction with respect to a first exposure light to expose a first shot region on the substrate using the first exposure light from the first pattern, and then while continuing movement of the substrate in the one direction, moving a second pattern in a specified direction to expose a second shot region on the substrate, which is adjacent to the first shot region, using a second exposure light from the second pattern;

then reversing the respective movement directions of the substrate and the second pattern so as to move in reverse directions, and synchronously moving the substrate in the reverse direction while moving the second pattern in the reverse direction to expose a third shot region on the substrate using the second exposure light from the second pattern; and continuing movement of the substrate in the reverse direction consecutively with exposure of the third shot region while moving the first pattern in the same direction as the movement direction of the second pattern during exposure of the third shot region to expose a fourth shot region on the substrate, which is adjacent to the third shot region, using the first exposure light from the first pattern.

19. The exposure method according to claim 18, further comprising:
when the substrate is moving in the one direction, moving the first pattern and the second pattern to simultaneously expose one shot region on the substrate using the first exposure light irradiated to the first exposure region and the second exposure light irradiated to the second exposure region;

reversing the respective movement directions of the substrate, the first pattern and the second pattern so as to be reverse directions; and when the substrate is moving in the reverse direction, moving the first pattern and the second pattern to simultaneously expose another one of the shot regions on the substrate using the first exposure light irradiated to the first exposure region and the second exposure light irradiated to the second exposure region.

20. A device manufacturing method comprising:
exposing a substrate using the exposure method according to claim 18; and
developing the exposed substrate.

* * * * *